United States Patent
Kawamura et al.

(10) Patent No.: US 10,444,290 B2
(45) Date of Patent: Oct. 15, 2019

(54) POWER SUPPLY APPARATUS, TRANSPORT DEVICE INCLUDING POWER SUPPLY APPARATUS, ESTIMATING METHOD OF ESTIMATING CORRELATION INFORMATION BETWEEN CHARGE RATE AND OPEN-END VOLTAGE OF ELECTRIC STORAGE SECTION, AND COMPUTER READABLE MEDIUM FOR ESTIMATING CORRELATION INFORMATION

(71) Applicant: HONDA MOTOR CO., LTD., Tokyo (JP)

(72) Inventors: Masayuki Kawamura, Saitama (JP); Hajime Fujita, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 319 days.

(21) Appl. No.: 15/470,902

(22) Filed: Mar. 27, 2017

(65) Prior Publication Data

US 2017/0285109 A1 Oct. 5, 2017

(30) Foreign Application Priority Data

Mar. 30, 2016 (JP) .................................. 2016-069701

(51) Int. Cl.
*H02J 7/00* (2006.01)
*G01R 31/367* (2019.01)
(Continued)

(52) U.S. Cl.
CPC ............ *G01R 31/367* (2019.01); *B60L 50/51* (2019.02); *B60L 58/12* (2019.02); *B60L 58/20* (2019.02); *G01R 31/382* (2019.01); *G01R 31/392* (2019.01); *H02J 1/00* (2013.01); *H02J 1/06* (2013.01); *H02J 1/12* (2013.01); *H02J 7/0008* (2013.01); *H02J 7/0009* (2013.01); *H02J 7/0021* (2013.01); *H02J 7/1423* (2013.01); *H02J 7/34* (2013.01); *B60L 2210/30* (2013.01); *B60L 2210/40* (2013.01); *H02J 2001/008* (2013.01); *H02J 2007/0096* (2013.01);
(Continued)

(58) Field of Classification Search
CPC .................................................... G01R 31/367
USPC ........................................................ 320/103
See application file for complete search history.

(56) References Cited

U.S. PATENT DOCUMENTS 8,648,571 B2 * 2/2014 Oki ..................... H01M 10/441
320/132
2010/0045239 A1 2/2010 Oki
2016/0257270 A1 * 9/2016 Teramoto ................ B60L 58/20

* cited by examiner

*Primary Examiner* — Edward Tso
*Assistant Examiner* — Ahmed H Omar

(57) ABSTRACT

A power supply apparatus has a first electric storage section, a second electric storage section having an excellent energy density and a poor output density compared with the first storage section, and a control section that acquires first data and second data before and after each time of transferring charge between the first and storage sections, the first data being a combination of an SOC and an OCV of the first storage section, the second data being a combination of an SOC and an OCV of the second storage section, estimates a first correlation between the SOC and the OCV of the first storage section from an aggregation of the first data including reference data, and estimates a second correlation between the SOC and the OCV of the second storage section based on a comparison between a plurality of stored data and an aggregation of the second data.

20 Claims, 13 Drawing Sheets

(51) Int. Cl.
    *G01R 31/382*     (2019.01)
    *G01R 31/392*     (2019.01)
    *H02J 1/00*     (2006.01)
    *H02J 1/06*     (2006.01)
    *H02J 1/12*     (2006.01)
    *H02J 7/14*     (2006.01)
    *H02J 7/34*     (2006.01)
    *B60L 50/51*     (2019.01)
    *B60L 58/12*     (2019.01)
    *B60L 58/20*     (2019.01)

(52) U.S. Cl.
    CPC ........ *Y02T 10/7005* (2013.01); *Y02T 10/7044* (2013.01); *Y02T 10/7066* (2013.01); *Y02T 10/7241* (2013.01)

POWER SUPPLY APPARATUS, TRANSPORT DEVICE INCLUDING POWER SUPPLY APPARATUS, ESTIMATING METHOD OF ESTIMATING CORRELATION INFORMATION BETWEEN CHARGE RATE AND OPEN-END VOLTAGE OF ELECTRIC STORAGE SECTION, AND COMPUTER READABLE MEDIUM FOR ESTIMATING CORRELATION INFORMATION

The contents of the following Japanese patent application(s) are incorporated herein by reference:
NO. 2016-069701 filed on Mar. 30, 2016.

BACKGROUND

1. Technical Field

The present invention relates to a power supply apparatus, a transport device including the power supply apparatus, an estimating method of estimating correlation information between a charge rate and an open-end voltage of an electric storage section, and a computer readable medium for estimating the correlation information.

2. Related Art

In a system having a plurality of storage batteries, a technique has been known for grasping an SOC (State Of Charge, charge rate) by performing charge/discharge between those storage batteries.

PRIOR ART DOCUMENT

Patent Document

[Patent Document 1] Japanese Patent Application Publication No. 2008-220080

SUMMARY

However, grasp of SOC is generally performed by using correlation information between an SOC and an OCV of an electric storage section and the measured OCV. The correlation information between the SOC and the OCV of this electric storage section is preset or is estimated based on some parameters so as to increase the accuracy for grasping the SOC. However, there has been a problem that the correlation information between the SOC and the OCV of the electric storage section cannot be efficiently estimated.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
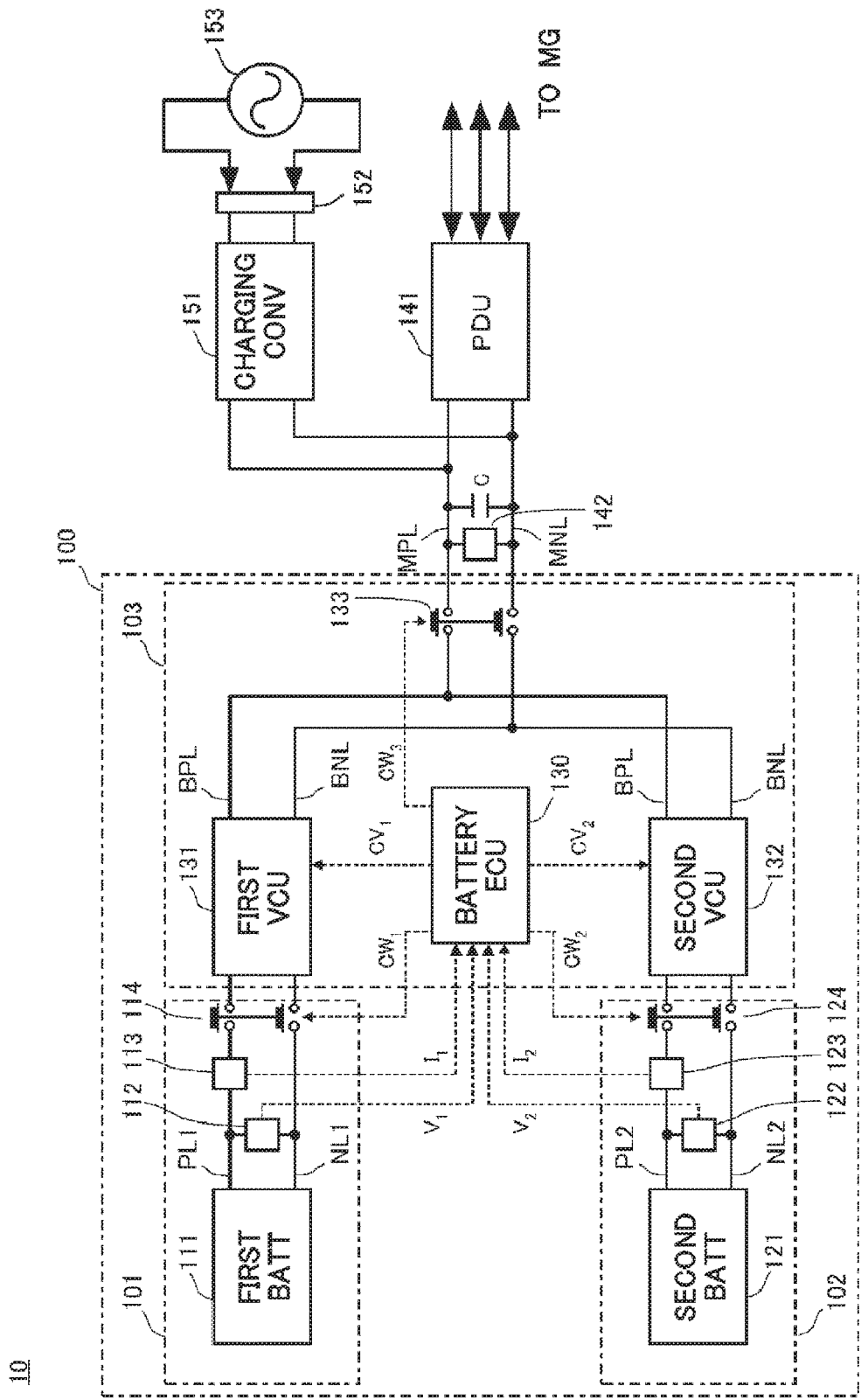
FIG. 1 shows a block diagram of a transport device according to the present embodiment.

FIG. 1 is a block diagram of a transport device 10 according to the present embodiment. The transport device according to the present embodiment is, for example, an electric vehicle. In the followings, a power storage device 100 according to the present embodiment will be described assuming a case of being utilized mounted on an electric vehicle. The power storage device 100 is one example of the power supply apparatus.

The transport device 10 runs by rotationally driving a motor generator MG by a PDU 141, the PDU 141 being a power drive unit and receiving a driving power supplied from the mounted power storage device 100.

The PDU 141 is connected to the power storage device 100 through a main positive busbar MPL and a main negative busbar MNL. A smoothing condenser C is connected between the main positive busbar MPL and the main negative busbar MNL, reducing a high frequency component of a conducting power. A third voltage sensor 142 detects a voltage Vh between the main positive busbar MPL and the main negative busbar MNL, and the detected voltage Vh is utilized for controlling the PDU 141.

The PDU 141 converts a driving power (DC power) supplied from the main positive busbar MPL and the main negative busbar MNL into AC power and outputs it to a motor generator MG. The motor generator MG includes, for example, a three-phase AC rotary electric machine. The motor generator MG rotates wheels via a motive power transmission mechanism and a drive shaft. Also, when the wheels are decelerated, the PDU 141 converts AC power generated by the motor generator MG into DC power to output to the main positive busbar MPL and the main negative busbar MNL as a regeneration power.

A first storage battery 111 and a second storage battery 121 which are included in the power storage device 100 are charged by the regeneration power generated by the motor generator, and an external power from an external power supply 153.

A charging converter 151 is provided between the main positive busbar MPL and the main negative busbar MNL and the power reception section 152. Further, the charging converter 151 converts the AC power supplied from the external power supply 153 (for example, a household AC power supply) via a power reception section 152 into the DC power to output to the main positive busbar MPL and the main negative busbar MNL. The power reception section 152 is an input terminal for receiving an input of the AC power supplied from the external power supply 153. It should be noted that in lieu of or otherwise in addition to the main positive busbar MPL and the main negative busbar MNL, the charging converter 151 may be connected to a positive electrode line PL1 and a negative electrode line NL1, or may be connected to a positive electrode line PL2 and a negative electrode line NL2.

The power storage device 100 includes a first electric storage module 101, a second electric storage module 102, and a charge/discharge circuit module 103. The first electric storage module 101 includes a first storage battery 111, a first voltage sensor 112, a first current sensor 113, and a first switch 114. The second electric storage module 102 has a similar configuration to the first electric storage module 101, and has a second storage battery 121, a second voltage sensor 122, a second current sensor 123, and a second switch 124. The charge/discharge circuit module 103 performs charge/discharge between the first storage battery 111 and the second storage battery 121. The charge/discharge circuit module 103 has a battery ECU 130 as a control section and a first VCU 131, a second VCU 132, and a third switch 133, which may function as charge/discharge circuits.

In the present embodiment, the first storage battery 111 which functions as a first electric storage section and the second storage battery 121 which functions as a second electric storage section are DC power supplies capable of charging/discharging, and include a secondary battery, such as a lithium-ion battery or a nickel-hydrogen battery, a sodium-ion battery, a lithium-sulfur battery and the like. Other than these, an element capable of charging/discharging, such as a condenser, a capacitor and the like, may also be included. However, the first storage battery 111 and the second storage battery 121 are batteries which have characteristics different from each other. Specifically, the first storage battery 111 is a so-called high-output type battery having a higher mass output density, which is an output power per unit mass, than the second storage battery 121. On the other hand, the second storage battery 121 is a so-called high-capacity type battery having a higher mass energy density, which is a storage power per unit mass, than the first storage battery 111. The first storage battery 111 may have a higher volume output density, which is an output power per unit volume, than the second storage battery 121, and the second storage battery 121 may have a higher volume energy density, which is a storage power per unit volume, than the first storage battery 111. In this way, power which can be retrieved from the first storage battery 111 per unit mass or unit volume is larger than a power which can be retrieved from the second storage battery 121 per unit mass or unit volume. On the other hand, power which can be stored by the second storage battery 121 per unit mass or unit volume is larger than a power which can be stored by the first storage battery 111 per unit mass or unit volume. In this way, the first storage battery 111 has a poor energy density and an excellent output density, compared with the second storage battery 121. Also, the second storage battery 121 may have a large battery capacity compared with the first storage battery 111.

The first storage battery 111 is connected to the first VCU 131 via the positive electrode line PL1 and the negative electrode line NL1. The first voltage sensor 112 detects a voltage between the positive electrode line PL1 and the negative electrode line NL1, i.e. a voltage $V_1$ of the first storage battery 111, and outputs the detected value to the battery ECU 130. The first current sensor 113 detects current $I_1$ which is input/output to/from the first storage battery 111 and outputs the detected value to the battery ECU 130.

The first switch 114 is a switch for opening/closing electric circuits of the positive electrode line PL1 and the negative electrode line NL1. It receives an opening/closing instruction signal $CW_1$ from the battery ECU 130 and switching the open state/closed state. The $V_1$ detected by the first voltage sensor 112 when the first switch 114 is in the open state is $OCV_1$ which is the OCV in the first storage battery 111.

The second storage battery 121 is connected to the second VCU 132 via the positive electrode line PL2 and the negative electrode line NL2. The second voltage sensor 122 detects a voltage between the positive electrode line PL2 and the negative electrode line NL2, i. e. a voltage $V_2$ of the second storage battery 121 and outputs the detected value to the battery ECU 130. The second current sensor 123 detects current $I_2$ input/output to/from the second storage battery 121 and outputs the detected value to the battery ECU 130.

The second switch 124 is a switch for opening/closing electric circuits of the positive electrode line PL2 and the negative electrode line NL2. It receives an opening/closing instruction signal $CW_2$ from the battery ECU 130 and switching the open state/closed state. The $V_2$ detected by the second voltage sensor 122 when the second switch 124 is in the open state is $OCV_2$ which is the OCV in the second storage battery 121.

It should be noted that the first current sensor 113 and the second current sensor 123 detect output currents (discharge currents) from the respectively corresponding storage batteries as positive values and detect input currents (charge currents and regeneration currents) as negative values. Although in FIG. 1 a configuration for detecting the currents of the respective positive electrode lines is shown, the configuration may be one for detecting the currents of the negative electrode lines.

The first VCU 131 is provided between positive and negative electrode lines (PL1 and NL1), and positive and negative electrode connection lines (BPL and BNL), receives the control signal $CV_1$ from the battery ECU 130, and performs a voltage conversion between the positive and negative electrode lines (PL1 and NL1), and the positive and negative electrode connection lines (BPL and BNL). The second VCU 132 is provided between t positive and negative electrode lines (PL2 and NL2), and the positive and negative electrode connection lines (BPL and BNL), receives the control signal $CV_2$ from the battery ECU 130, and performs a voltage conversion between the positive and negative electrode lines (PL2 and NL2), and the positive and negative electrode connection lines (BPL and BNL).

The positive electrode connection line BPL is connected to the main positive busbar MPL, and the negative electrode connection line BNL is connected to the main negative busbar MNL. In the connection section, a third switch 133 is provided. The third switch 133 is a switch for opening/closing electric circuits of the positive electrode connection line BPL and the main positive busbar MPL, and of the negative electrode connection line BNL and the main negative busbar MNL. It receives an opening/closing instruction signal $CW_3$ from the battery ECU 130, and switches the open state/closed state.

In the above configurations, in a case where the first switch 114 and the third switch 133 are in the closed state and the second switch 124 is in the open state, the power in the first storage battery 111 is supplied to the PDU 141. Also, in a case where the second switch 124 and the third switch 133 are in the closed state and the first switch 114 is in the open state, the power in the second storage battery 121 is supplied to the PDU 141. Further, in a case where the first switch 114, the second switch 124, and the third switch 133 are in the closed state, the power in the first storage battery 111 and the power in the second storage battery 121 are supplied together to the PDU 141. However, when the power in the first storage battery 111 and the power in the second storage battery 121 are supplied together to the PDU 141, a voltage conversion is performed by the first VCU 131 and the second VCU 132, such that the supplied voltages are the same. It should be noted that when the regeneration power is supplied from the PDU 141, or when an external power from the external power supply 153 is supplied, the power flow is in a reverse direction to the direction in each case described above.

Also, in the present embodiment, a so-called 2 VCU type is adopted, in which a VCU being a voltage conversion unit is provided in each storage battery; however, in terms of adjustment of the output voltage of one storage battery with respect to the output voltage of the other storage battery, a so-called 1 VCU type may be adopted, in which one VCU is provided in either of the storage batteries. The 1 VCU type contributes to a reduction of space for arranging the VCU. Also, it contributes to cost reduction and weight reduction as well. In this case, the voltage supplied to the PDU 141 is the output voltage of the storage battery in which the VCU is not provided, so if this restriction is inconvenient, the 2 VCU type may be adopted.

It should be noted that converters are roughly categorized into a step-up type, a step-down type, and a step-up/down type, and any type of the converters may be adopted for the first VCU 131 and the second VCU 132. Also, the types of the converters adopted for the first VCU 131 and the second VCU 132 may be different from each other. By appropriately combining the converter types of the first storage battery 111 and the second storage battery 121, they can be utilized as a whole that satisfies a requested specification, just like one battery.

In a case where the first switch 114 and the second switch 124 are in the closed state and the third switch 133 is in the open state, the charge/discharge is performed between the first storage battery 111 and the second storage battery 121. For this charge/discharge between the storage battery sections, the power flow is determined in accordance with a difference between a conversion voltage value of the first VCU 131 determined by the control signal $CV_1$ from the battery ECU 130 and a conversion voltage value of the second VCU 132 determined by the control signal $CV_2$. Therefore, the battery ECU 130 can perform control to determine which storage battery is to supply power and which storage battery is to receive power by sending, to the respective VCUs, the control signals $CV_1$ and $CV_2$ which instruct the conversion voltage values. It should be noted that the control may be performed so as to stop the voltage conversion, to control in a so-called direct coupling mode for outputting the output voltage of the storage battery as it is, and to change the other conversion voltage value by fixing a high-side switch of one of the first VCU 131 and the second VCU 132 to the "closed" state as well as a low-side switch of the other to the "open" state. At this time, the battery ECU 130 can grasp a charge/discharge amount in the first storage battery 111 by monitoring the $V_1$ and the $I_1$, and can grasp a charge/discharge amount in the second storage battery 121 by monitoring the $V_2$ and the $I_2$.

As described above, the power storage device 100 in the present embodiment includes two storage batteries having characteristics different from each other. A system using a plurality of the storage batteries having characteristics different from each other needs to finely control how to respond a requested power supply in accordance with the characteristics or states of the respective storage batteries. Here, at first, a difference in power outputs between a case of using a single storage battery and a case of using a plurality of storage batteries having different characteristics will be described.

Figure 2:
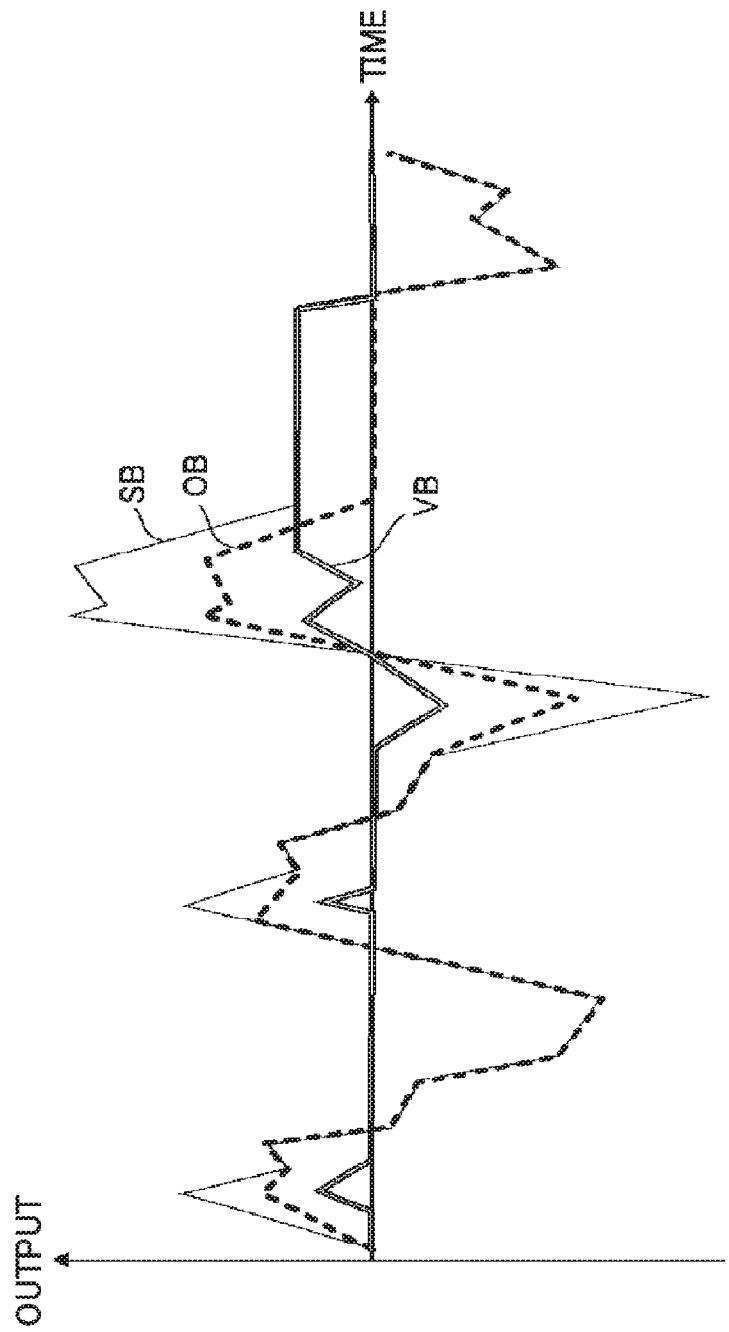
FIG. 2 shows a drawing for a comparison of power outputs between a case where a single storage battery is used and a case where two storage batteries are used.

FIG. 2 is a drawing for a comparison of power outputs between a case of using a single storage battery and a case of using two storage batteries having different characteristics. The horizontal axis indicates the lapse of time, and the vertical axis indicates the power output. An area in which the power output is negative indicates that the regeneration power is input, for example.

SB shown by the solid line indicates an output power change in a case where the power storage device is configured with one storage battery. In a case where the power storage device includes only one storage battery, power requested by the load side is output as requested in the capability range and input power is accepted as it is. Therefore, there may also be a case where a large output/input is performed within a short period of time, and there is a problem that the storage battery is rapidly degraded and the like as well.

In a case where a power storage device is configured with two storage batteries having different characteristics, the output/input can be shared in accordance with the respective characteristics. OB shown by the dotted line indicates an output power change of a high-output type battery, and VB shown by double lines indicates an output power change of a high-capacity type battery. At each time, an SB value is obtained by adding an OB value to a VB value. That is, a situation is shown, where the power requested by the load side is shared by the high-capacity type battery and the high-capacity type battery.

In the high-capacity type battery, generally, since the degradation progresses due to high output/input and an immediate change of the output/input, it is preferable to control the output/input to be performed in a range in which the degradation progress is suppressed. Therefore, as it can be seen from the change in the OB and the VB, if a large output/input is requested by the load side, the high-output type battery (OB) performs the control basically, and if the high-output type battery is not able to support, the high-capacity type battery (VB) assists the output/input. Also, the high-capacity type battery is adapted in a case where the output is continued with a value which is not very high, and in this case, the output of the high-output type battery can be suppressed. Also, since the high-capacity type battery has a characteristic that it degrades easily if accepting a regeneration power corresponding to a high-rate charge, a control is performed in which the regeneration power is accepted by the high-output type battery as much as possible. It should be noted that if the regeneration power is greater than the capacity that the high-output type battery can accept, the generation of the regeneration power may be reduced by operating a brake, other than using the high-capacity type battery to accept. In this case, the degradation of the high-capacity type battery can be suppressed.

Also, the high-capacity type battery and the high-output type battery have influences of degradation respectively based on the SOCs, which are also significantly different from each other. For the high-capacity type battery, the influence of degradation does not greatly change even if the SOC changes. In other words, the degradation progress is not greatly influenced by the SOC even if any value. On the other hand, for the high-output type battery, as the SOC changes, the influence of degradation changes greatly in accordance with the value. To describe in more detail, although the influence of degradation of the high-output type battery is small in a central area in which the SOC is 30% to 70%, the influence of degradation becomes larger as it is away from this central area. That is, the degradation progresses more as it is away from the central area. Therefore, it is preferable to adjust the charge/discharge amounts of the high-capacity type battery and the high-output type battery such that the SOC of the high-capacity type battery is not belonged to a low area of 0% to 30% or a high area of 70% to 100%.

In this way, by utilizing the plurality of storage batteries having different characteristics, various output requests from the load side can be supported while the degradations of the respective storage batteries can be suppressed. However, it is important to precisely grasp the present states of the storage batteries to appropriately change or modify in accordance with the states how the respective storage batteries are properly used and in what proportion the output/input are combined. In particular, for a drive control of a transport device, it is very important to precisely grasp the SOC which changes moment by moment.

Figure 3:
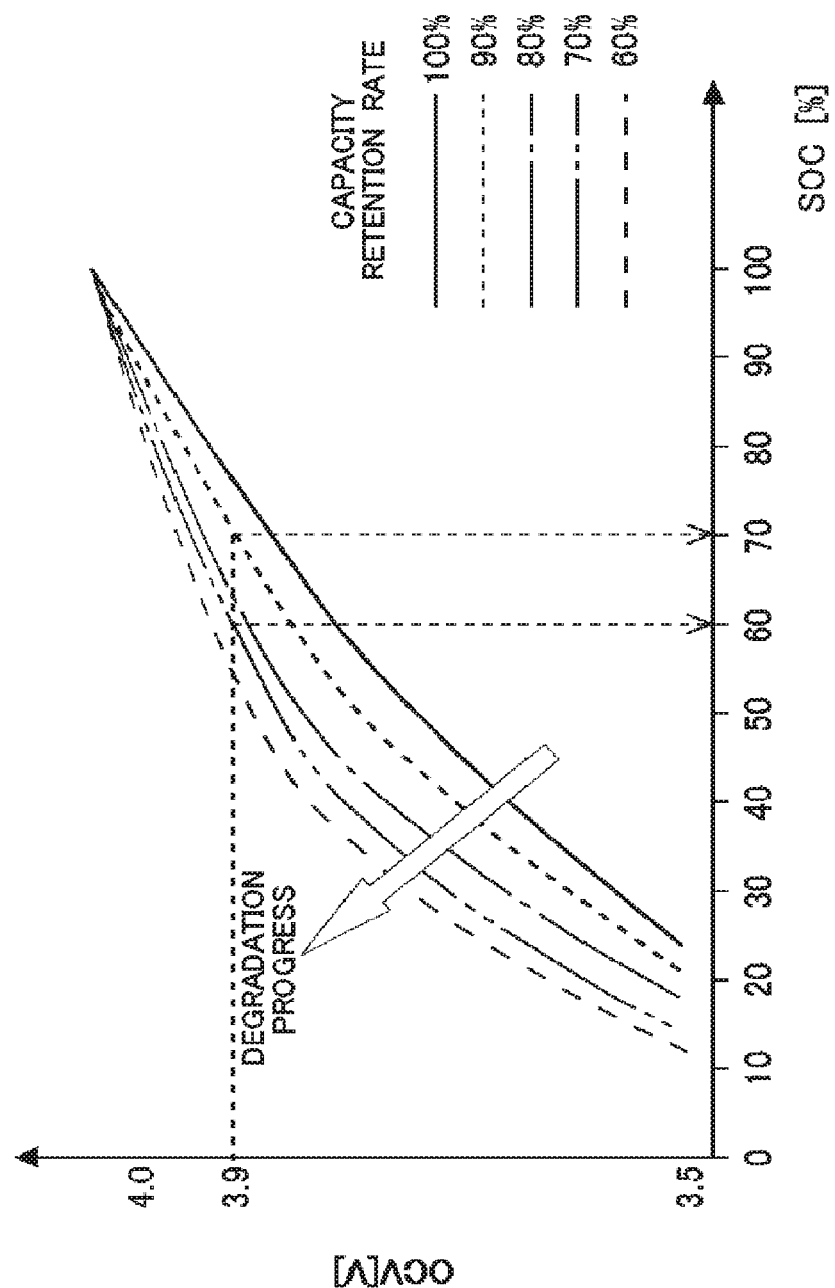
FIG. 3 shows a drawing for describing SOC-OCV curves of a storage battery.

Here, a correlation between the SOC and the OCV in the storage battery will be described. FIG. 3 is a graph showing SOC-OCV curves of a battery. The SOC-OCV curve is one example of correlation information which is a relation between the SOC and the OCV. The horizontal axis indicates the SOC by percent (%) and the vertical axis indicates the OCV by volt (V).

A plurality of curves drawn in the graph indicate the SOC-OCV curves with respect to the respective different capacity retention rates. The capacity retention rates show the degradation due to repeated uses or the degree of the degradation with the lapse of time, and specifically, indicate by percent the electricity amounts which can be stored if fully charged relative to the electricity amount (100%) which can be stored when the battery is new. For example, when the battery is charged to be fully charged at a time point when the battery has been repeatedly used, the storage battery in which only 80% of the electricity amount relative to the initial storage electricity amount can be stored is a storage battery having the capacity retention rate of 80%. In other words, it can be said that the capacity retention rate indicates a degree of degradation of the storage battery.

In FIG. 3, the solid line indicates the SOC-OCV curve having the capacity retention rate of 100%, the dotted line indicates 90%, the one-dot chain line indicates 80%, the two-dot chain line indicates 70%, and the dashed line indicates 60%. It should be noted that the SOC when having the capacity retention rate that is not 100% is the charge rate when the storage electricity amount fully charged in a state where the degradation has progressed is considered as 100%. It can be seen that the curve entirely transits in an upper-left direction as the degradation progresses. For example, in a case where the OCV is 3.9V, it can be seen that while the SOC when having the capacity retention rate of 90% is 70%, the SOC when having the capacity retention rate of 70% is 60%. Many storage batteries generally show a property with such a tendency.

That is, depending on the degree of the degradation of the storage battery mounted on the power storage device progresses at the present time, the SOCs to be estimated by the same OCV will be greatly different. In other words, if the degradation state of the storage battery is not considered, the SOC cannot be precisely grasped even though the OCV is measured.

Here, the power storage device 100 in the present embodiment performs charge/discharge control, for determining the SOC-OCV curve, to each of the mounted first storage battery 111 and second storage battery 121 at each time point when a predetermined condition is satisfied.

Figure 4:
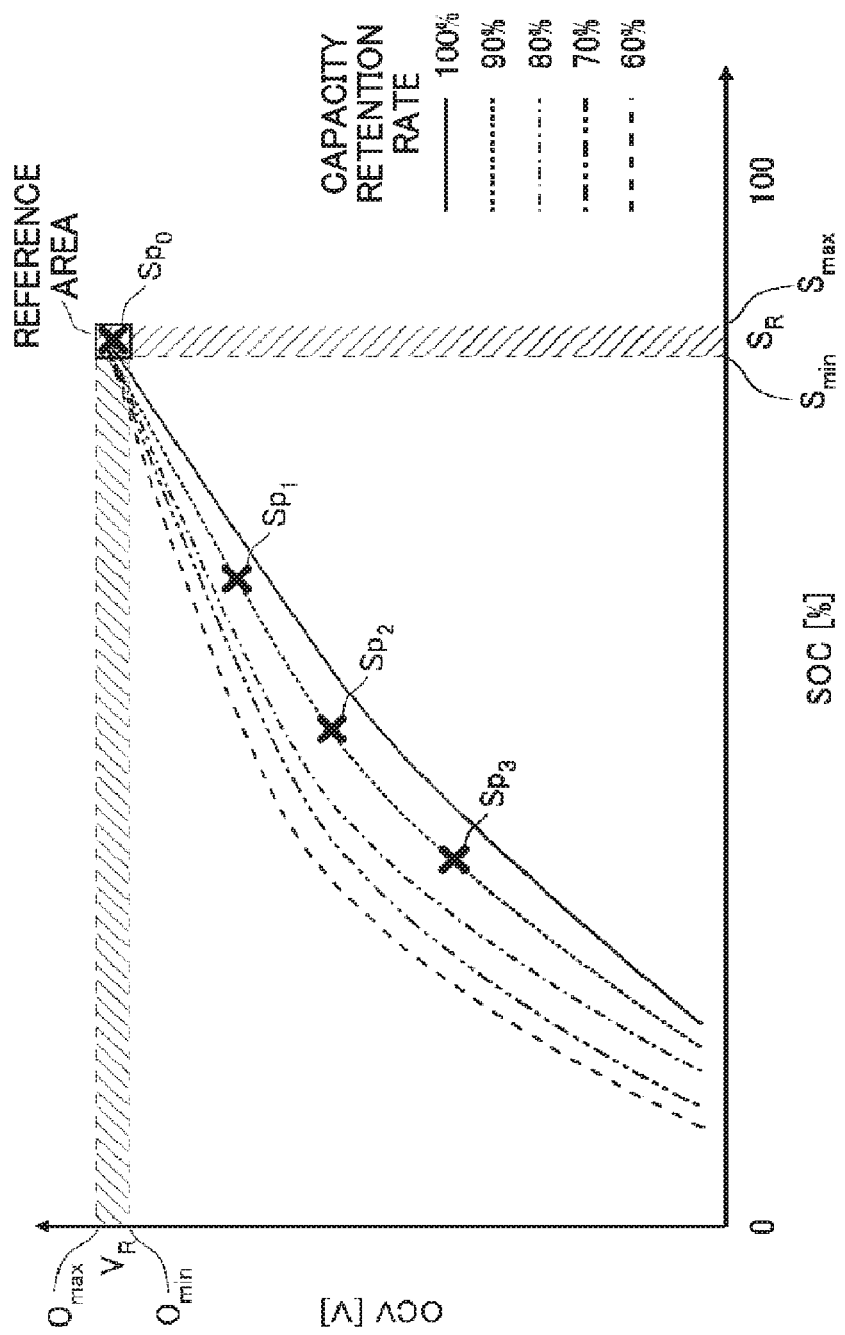
FIG. 4 shows a drawing for describing a procedure for determination of the SOC-OCV curve.

FIG. 4 is a drawing for describing the procedure until the SOC-OCV curve is determined at a time point. Same as FIG. 3, the horizontal axis indicates the SOC by percent (%) and the vertical axis indicates the OCV by volt (V). Also, the shown plurality of curves respectively indicate the SOC-OCV curves for respective capacity retention rates of the modeled storage batteries in accordance with the line types used in FIG. 3.

The Applicant found that, as a result of repeated considerations for various storage batteries, an area in which a variation of an SOC with respective to an OCV falls in a certain range exists in many storage batteries, even the SOC-OCV curves have capacity retention rates different from each other. Such an area is called a "reference area". The reference area can be seen in a range in which the SOC is close to 100%, for example. This is because that since the SOC in the fully charged voltage of the storage battery is defined as 100%, as the voltage of the storage battery is set to be in a vicinity of the fully charged voltage, the SOC becomes to be close to 100%, independently of the capacity retention rate. In the example of FIG. 4, it is shown that when the OCV is in a range of $V_R$ ($O_{min} \leq V_0 < O_{max}$), a residual capacity falls in a range of $S_R$ ($S_{min} \leq S_0 < S_{max}$) given that the capacity retention rate may be any rate. The OCV in the range of $V_R$ is called a "reference OCV", and the SOC in the range of the $S_R$ is called a "reference SOC".

For the range of the reference area, it is preferable to set the range of the reference OCV as 0.1V (the difference between $O_{max}$ and $O_{min}$), and the range of the reference SOC as 3% (the difference between $S_{max}$ and $S_{min}$). The range of the reference OCV here may be the range of the voltage in a single cell. The range of the reference OCV may be 3% of the nominal voltage of the storage battery. The range of the reference area may be appropriately optimized in accordance with the characteristic of the storage battery to be the target or the requested accuracy and the like.

The power storage device 100 in the present embodiment can perform the charge/discharge between the storage battery sections between the first storage battery section 111 and the second storage battery section 121, as described above. That is, the power of one storage battery can be transferred to the other one. Accordingly, by performing the charge/discharge between the storage battery sections, the OCV of the storage battery on the side to determine the SOC-OCV curve can be moved into the range of the reference OCV in the storage battery. Since the SOC corresponding to the reference OCV is the reference SOC independently of the capacity retention rate, if setting the value as an average value of $S_{max}$ and $S_{min}$, for example, a coordinate $Sp_0$ ($St_0$, $Ot_0$) can be plotted in the reference area on a two-dimensional plane of the SOC-OCV (here, it is called as an "SO plane").

After that, in accordance with the predetermined condition and number of times, the charge/discharge between the storage battery sections is performed repeatedly. At this time, for example, in a case where the storage battery on the side to determine the SOC-OCV curve is the first storage battery 111, an increase/decrease amount of the SOC of the first storage battery 111 can be calculated by monitoring the current $I_1$ of the first current sensor 113. Also, if the first switch 114 is set to be in the open state, the OCV of the first storage battery 111 at that time can also be detected. Accordingly, for each time when performing the charge/discharge between the storage battery sections, one coordinate Sp can be plotted on the SO plane. In the example of FIG. 4, after obtaining the coordinate $Sp_0$ within the reference area, the charge/discharge between the storage battery sections is repeatedly performed for three times to obtain coordinates $Sp_0$, $Sp_2$, and $Sp_3$.

For example, depending on the battery makers, the SOC-OCV curve with respect to each capacity retention rate for each model number of the storage battery is prepared in advance as reference data. In FIG. 4, the SOC-OCV curves for respective 100%, 90%, 80%, 70%, and 60% are the reference data. It is preferable that the reference data has been prepared in a finer proportion, such as per 5% or per 1% and the like. Or, for a range in which a variation of the SOC-OCV curves with respect to the capacity retention rates is large, the reference data may be provided in a finer proportion than a small range, and efforts required for preparation of the data amount and the reference data can be reduced. Specifically described later, the power storage device 100 stores this reference data in a storage section, and the battery ECU 130 can appropriately refer to the reference data.

As a plurality of coordinates Sp are obtained by repeatedly performing the charge/discharge between the storage battery sections, the battery ECU 130 selects, from the reference data by a matching process, an SOC-OCV curve having the highest matching degree to these coordinates. For example, an SOC-OCV curve having the smallest deviation from the plurality of coordinates Sp is selected. The SOC-OCV curve selected at this time is the most probable SOC-OCV curve at that time point. In this way, the SOC-OCV curve of the storage battery at that time point is estimated. In the example of FIG. 4, it is the SOC-OCV curve having the capacity retention rate of 90%. By prestoring this SOC-OCV curve, for a confirmation of the SOC requested from outside, an SOC with a high accuracy at that time point can be immediately returned as the OCV is measured. In this way, the SOC-OCV curve appropriately determined by performing the charge/discharge between the storage battery sections, since a real SOC-OCV curve at that time point is shown with higher fidelity, an SOC extremely close to a real SOC can be returned to the confirmation request from the outside.

It should be noted that in the above-described description, although the charge/discharge between the storage battery sections is performed so as to first obtain the coordinate $Sp_0$ within the reference area, the order for obtaining the coordinates Sp is not limited to this. As a result of performing the charge/discharge between the storage battery sections for a plurality of times, as at least one coordinate Sp is included within the reference area, the matching process to the reference data can be performed. In a case where an undue charge/discharge between the electric storage sections is necessary in order to set the SOC and the OCV of one storage battery in the reference area, it is preferable to move the voltage and the SOC of the storage battery generating the SOC-OCV curve into the reference area while obtaining a plurality of coordinates, by performing the charge/discharge between the electric storage sections for a plurality of times. Then, by modifying the coordinates obtained by the charge/discharge between the electric storage sections for a plurality of times based on the reference area, a precise SOC-OCV curve can be generated, without any need of the undue charge/discharge between the electric storage sections just for setting the voltage and the SOC of the electric storage section generating the SOC-OCV curve in the reference area.

Also, in the above-described description, although the SOC-OCV curve having the highest matching degree is selected from the reference data, the selection may be at first, made from a plurality of SOC-OCV curves having deviations of the respective coordinates not more than a threshold, and next, one SOC-OCV curve may be determined based on other references from those. As the other references, such as that a deviation is smaller as the coordinate is newly acquired and the like can be given. With such a configuration, the SOC-OCV curve can be specified even if in a state where the charge/discharge between the electric storage sections has to be stopped on the way of performing due to some situations.

In the above-described description, the SOC-OCV curves are estimated by performing a matching process of each SOC-OCV curve of reference data to a plurality of coordinates Sp. However, in a case where the coordinates Sp in a wide range of SOC are acquirable, an approximate curve or an approximate straight line may be calculated from the plurality of coordinates Sp without referring to the reference data, and the approximate curve or the approximate straight line may be estimated as the SOC-OCV curve. The approximate curve or the approximate straight line may be calculated by fitting based on the least-squares method and the like. For the coordinates Sp on the SOC-OCV plane, the approximate straight line in each section may be calculated by connecting the adjacent SOCs by straight lines.

If three or more points of the coordinates Sp exist, a polygonal line as an aggregation of the approximate straight lines is calculated. It should be noted that the SOC-OCV curve of each capacity retention rate in the reference data has high reliability since it is the representative data of the type of the storage battery, which is prepared by the battery maker, for example. However, since a variation of individual product is not supported, the variation becomes an error. However, if the approximate curve or the approximate straight line is calculated from the actually-measured coordinates Sp, a real SOC-OCV curve which absorbs the individual variation can be obtained. Therefore, there is a possibility that the curve can be utilized as the SOC-OCV curve with higher accuracy. Also, depending on the types of the storage batteries, the reference area may not exist in some cases. In such a case, the SOC-OCV curve can be determined by using the approximate curve or the approximate straight line calculated from the actually-measured coordinates Sp and the reference data at the same time. Specifically, the one in a shape closest to that of the approximate curve or the approximate straight line calculated from the actually-measured coordinates Sp among the SOC-OCV curves for each capacity retention rate included in the reference data may be determined as the SOC-OCV curve. Also, in a case of estimating the SOC-OCV curve by the approximate curve or the approximate straight line, when estimating a present capacity retention rate of the storage battery, the capacity retention rate corresponding to the SOC-OCV curve having a shape closest to that of the approximate curve or the approximate straight line among the SOC-OCV curves of the reference data may be estimated as the present capacity retention rate.

Figure 5:
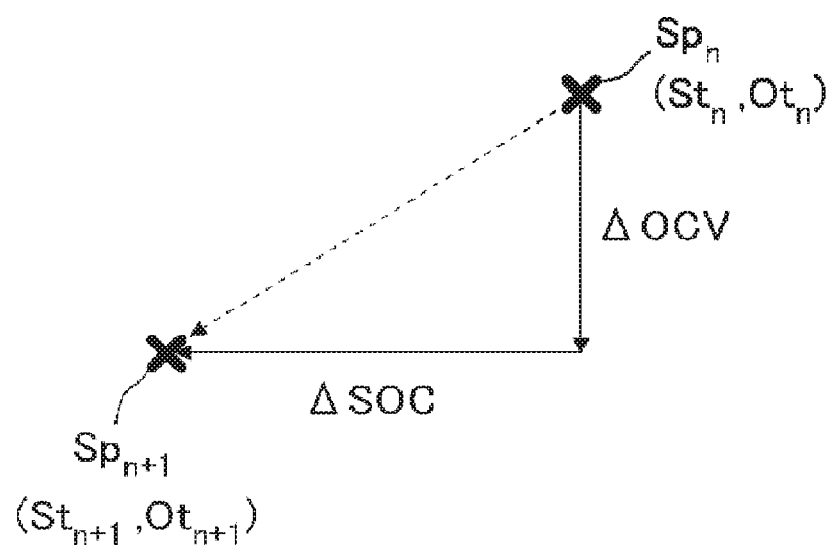
FIG. 5 shows a drawing for describing a computation for determining coordinates on a planar space.

Here, a procedure of performing the charge/discharge between the storage battery sections and determining the next coordinate Sp will be described. FIG. 5 is a drawing for describing a computation for determining the coordinates on a planar space. $Sp_n$ shown as a first x mark is plotted as the nth coordinate on the SO plane and is shown by a coordinate value $(St_n, Ot_n)$. The n+1th coordinate plotted performing the charge/discharge between the storage battery sections for one time after this is $Sp_{n+1}$ shown as a second x mark.

Differences between the respective coordinate values are shown as ΔOCV for the OCVs, as ΔSOC for the SOCs, and may be respectively positive values in some cases, or may be negative values in some cases. That is: $(S_{n+1}, Ot_{n+1})$= $(St_n+\Delta SOC, Ot_n+\Delta OCV)$. Here, since $Ot_n$ and $Ot_{n+1}$ are both the OCVs, these values can be directly obtained by actual measurement. On the other hand, ΔSOC is: $\Delta SOC=St_{n+1}-St_n$, and is calculated according to: $\Delta SOC=\Sigma I/C_{full}$ or $\Delta SOC=\Delta Ah/C_{full}$. Here, ΣI is a sum of values output by the current sensor from a time $t_n$ to a time $t_{n+1}$, and ΔAh indicates an electricity amount changed during this period. Also, $C_{full}$ is an electricity amount when fully charged at the time point of the former SOC-OCV curve determination. The value of $C_{full}$ is stored in the storage section for each time when the SOC-OCV curve is determined. For example, as the SOC-OCV curve is determined, $C_{full}$ is determined in accordance with the capacity retention rate and the initial capacity corresponding to the determined SOC-OCV curve.

It should be noted that in the above description, the process of determining the SOC-OCV curve has been mainly described using the coordinates SP on the two-dimensional plane for a purpose of describing easily understandably. Plotting the coordinates SP or specifying the coordinates SP corresponds to acquiring and storing data of (SOC, OCV), as an internal process. Also, in the above description, the process of determining the SOC-OCV curve has been mainly described by giving a case of acquiring one OCV for each SOC for a purpose of describing easily understandably as an example. However, one or more OCVs for each SOC may be acquired.

Figure 6:
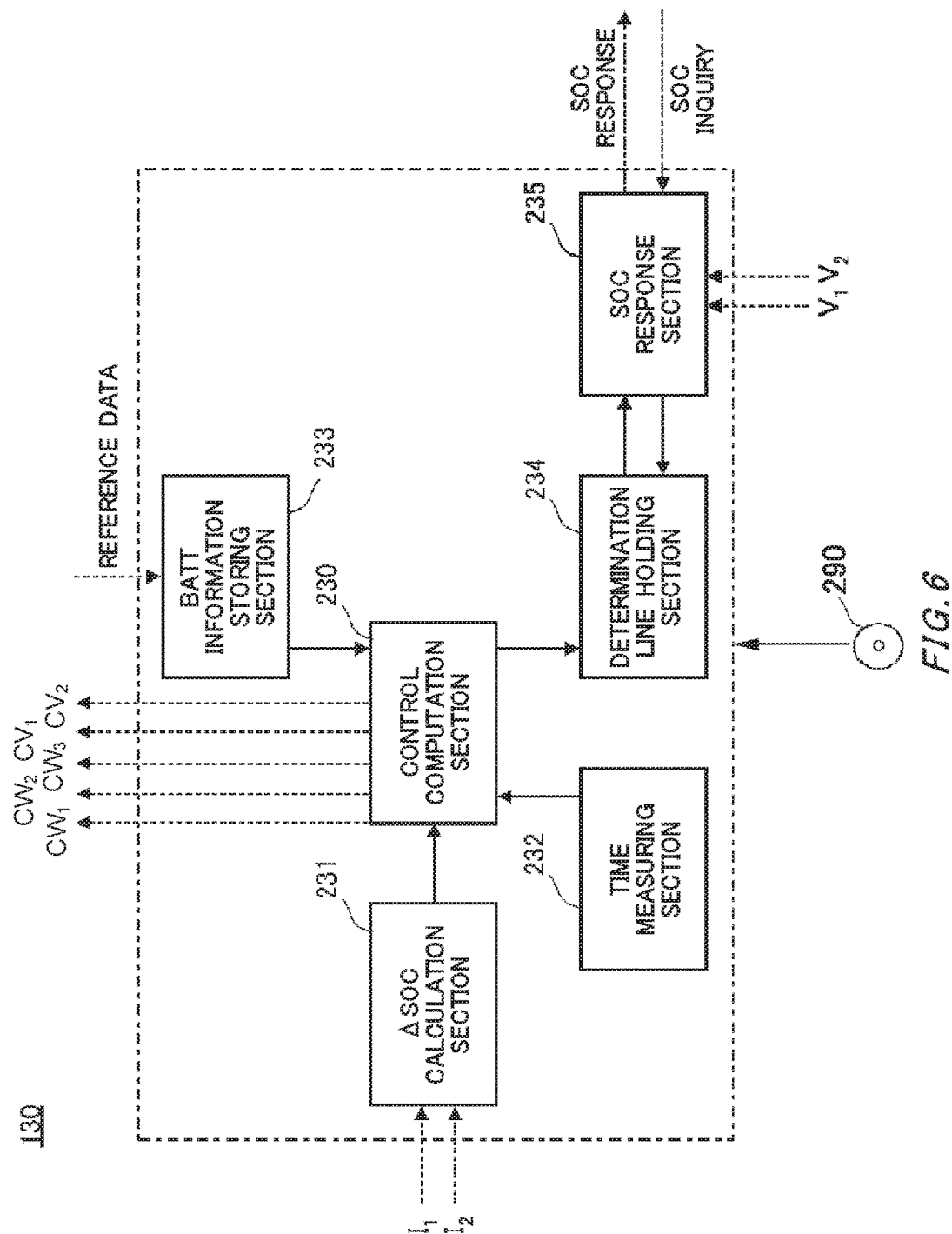
FIG. 6 shows an internal block diagram of a battery ECU 130 along with a recording medium 290 for storing a program used for the battery ECU 130.

The followings will describe how the battery ECU 130 performs determining the SOC-OCV curve described above by showing the battery ECU 130 with functional blocks. FIG. 6 shows an internal block diagram of the battery ECU 130 along with a recording medium 290 which stores a program for the battery ECU 130.

As illustrated, the battery ECU 130 includes a control computation section 230 performing an entire control and computation, a ΔSOC calculation section 231, a time measuring section 232, a BATT information storing section 233, and a determination line holding section 234. Processes until the SOC-OCV curve is determined are performed according to these functional blocks. In addition to these, the battery ECU 130 also mainly includes an SOC response section 235.

The control computation section 230 acquires a first data and a second data before and after each of a plurality of times of charge transfers between the first storage battery 111 and the second storage battery 121, the first data being a combination of a first SOC and a first OCV that are a charge rate and an open-end voltage of the first storage battery 111, the second data being a combination of a second SOC and a second OCV that are the charge rate and the open-end voltage of the second storage battery 121. The first data is an aggregation of (SOC, OCV) data of the first storage battery 111, for example. The second data is an aggregation of (SOC, OCV) data of the second storage battery 121, for example.

The control computation section 230 performs a first operation of generating a first correlation which is the correlation information between the SOC and the OCV of the first storage battery 111 from the aggregation of the first data including the reference data. The control computation section 230 performs a second operation of estimating a second correlation which is the correlation information between the SOC and the OCV of the second storage battery 121 based on a comparison between a plurality of stored data stored by the battery ECU 130 and the aggregation of the second data.

The plurality of stored data may have been stored in the BATT information storing section 233. Also, the reference data may be the first data which has a deviation of SOCs to the same OCV in a plurality of degradation states of the first storage battery 111, the deviation not more than a threshold.

The control computation section 230 may associate the stored data with the degradation states of the second storage battery 121 and store the stored data. For example, the stored data may be the SOC-OCV curves with respective to different capacity retention rates. The control computation section 230 may estimate the present degradation state of the second storage battery 121 and compare the aggregation of the second data with the stored data only associated with a degradation state that progressed more than the present degradation state among the plurality of stored data. It should be noted that the control computation section 230 may determine the present degradation state based on the estimated second correlation.

The control computation section 230 may select the stored data to be compared with a plurality of aggregations of the second data among the plurality of the stored data based on an accumulated value of currents charged/discharged by the second storage battery 121 from a time when the second correlation was estimated last time. For example, the control computation section 230 may select the stored data to be compared with a plurality of aggregations of the second data by excluding the stored data associated with a degradation state which progressed more than a degradation state corresponding to the accumulated value of currents by a predetermined value or more.

The control computation section 230 may generate the first correlation based on the approximate curve or the approximate straight line with respect to the aggregation of the first data. On the other hand, when generating the second correlation, the control computation section 230 may generate the second correlation by selecting with higher priority the stored data having a higher adaptability to the aggregation of the second data among the plurality of stored data.

The control computation section 230 may acquire the first SOC after the charge transfer based on a charge transfer amount to the first storage battery 111 from a time when the SOC of the first storage battery 111 is included in a range of a reference SOC which is the SOC having a difference of OCVs with respect to the same SOC in a plurality of degradation states of the first storage battery 111, the difference not more than a threshold. The control computation section 230 may acquire the first SOC after the charge transfer based on the charge transfer amount to the first storage battery 111 from a time when the SOC of the first storage battery 111 is included in a range of a reference OCV which is the OCV corresponding to the reference SOC.

If the SOC of the first storage battery 111 is not included in the range of the reference SOC before performing the charge transfer, the control computation section 230 may perform, prior to the charge transfer, the charge/discharge between the first storage battery 111 and the second storage battery 121 such that the OCV of the first storage battery 111 is included in the range of the reference SOC. If the OCV of the first storage battery 111 is not included in the range of the reference OCV before performing the charge transfer, the control computation section 230 may perform, prior to the charge transfer, the charge/discharge between the first storage battery 111 and the second storage battery 121 such that the OCV of the first storage battery 111 is included in the range of the reference OCV.

At least one of the first storage battery 111 and the second storage battery 121 supplies power to a motor generator MG. The motor generator MG is one example of the driving section. The charge/discharge circuit module 103 may perform the charge/discharge among the first storage battery 111, the second storage battery 121, and the driving section. The control computation section 230 may control the charge/discharge circuit so as not to perform the charge/discharge between the first storage battery 111 and the driving section and between the second storage battery 121 and the driving section during a period when the charge transfer is performed.

It should be noted that the battery ECU 130 is one type of computer. The control computation section 230 is, for example, configured with a MPU, for example, executes a program stored in an internal storage section of the MPU, and controls the entire power storage device 100 in accordance with the program. The program executed by the battery ECU 130 is supplied from the recording medium 290 to the battery ECU 130. It should be noted that the recording medium 290 is one example of a medium which is readable by a computer. In the battery ECU 130, any medium in which a program or a computer instruction is stored can be considered as a medium for storing the program for the battery ECU 130.

The control computation section 230 controls the charge/discharge circuit module 103. Also, the control computation section 230 sends opening/closing instruction signals $CW_1$, $CW_2$, and $CW_3$ respectively toward a first switch 114, a second switch 124 and a third switch 133 to open/close them depending on the situations. Also, the control signals $CV_1$ and $CV_2$ which are PWM signals are sent respectively toward a first VCU 131 and a second VCU 132 to adjust their conversion voltages. The ΔSOC calculation section 231 acquires $I_1$ from the first current sensor 113 and calculates ΔSOC when acquiring the (SOC, OCV) data of the first storage battery 111. Similarly, $I_2$ is acquired from the second current sensor 123 and ΔSOC is calculated when acquiring the (SOC, OCV) data of the second storage battery 121. The ΔSOC calculation section 231 hands off the calculated ΔSOC to the control computation section 230.

The time measuring section 232 hands off the time when the charge/discharge between the storage battery sections is performed to the control computation section 230. The control computation section 230 prestores the time when the (SOC, OCV) data is acquired in the internal storage section, and if the time when the (SOC, OCV) data is acquired is beyond the predetermined lapse time, excludes the (SOC, OCV) data from the matching process target.

The BATT information storing section 233 is a storage section to store the above-described reference data. Specifically, the BATT information storing section 233 is configured with a non-volatile flash memory and the like. The BATT information storing section 233 acquires the reference data from an external device. It should be noted that the BATT information storing section 233 is not limited to store the reference data, but also stores various information about the storage battery and provides the information to the control computation section 230 if necessary. The BATT information storing section 233 prestores the correlation information between the SOC and the OCV in a plurality of degradation states of the first storage battery 111. The BATT information storing section 233 prestores the correlation information between the SOC and the OCV in a plurality of degradation states of the second storage battery 121. For example, when manufacturing the power storage device 100, the correlation information between the SOC and the OCV in the plurality of degradation states of the first storage battery 111 and the correlation information between the SOC and the OCV in the plurality of degradation states of the second storage battery 121 are stored in the BATT information storing section 233. It should be noted that for the storage battery which is not the estimation target of the SOC-OCV curve between the first storage battery 111 and the second storage battery 121, its correlation information may not be stored in the BATT information storing section 233. The control computation section 230 may estimate the correlation information based on the approximate curve or the approximate straight line with respect to the plurality of data including the target SOC and the target OCV. The control computation section 230 may select with higher priority, among the correlation information between the SOC and the OCV in the plurality of degradation states of the target storage battery stored by the BATT information storing section 233, the correlation information having a higher adaptability to the plurality of (SOC, OCV) data including the target SOC and the target OCV, as the correlation information to be estimated.

The determination line holding section 234 is a storage section to store the SOC-OCV curve determined by the control computation section 230. Specifically, the determination line holding section 234 is configured with a non-volatile flash memory and the like. The determination line holding section 234 may be configured integrally with the BATT information storing section 233 as the storage section.

The SOC response section 235 is connected to the determination line holding section 234. As the SOC response section 235 receives an inquiry about the SOC from outside, the SOC response section 235 acquires $V_1$ and $V_2$ as the OCVs, refers to the SOC-OCV curves stored in the determination line holding section 234, and returns the SOC. In a case where the correlation information of the first storage battery 111 is estimated by the control computation section 230, when the SOC response section 235 receives the inquiry about the SOC of the first storage battery 111, the SOC response section 235 calculates the SOC of the first storage battery 111 to respond, based on the OCV of the first storage battery 111 and the correlation information estimated by the control computation section 230. In a case where the correlation information of the second storage battery 121 is estimated by the control computation section 230, when the SOC response section 235 received the inquiry about the SOC of the second storage battery 121, the SOC response section 235 calculates the SOC of the second storage battery 121 to respond, based on the OCV of the second storage battery 121 and the correlation information estimated by the control computation section 230.

Figure 7:
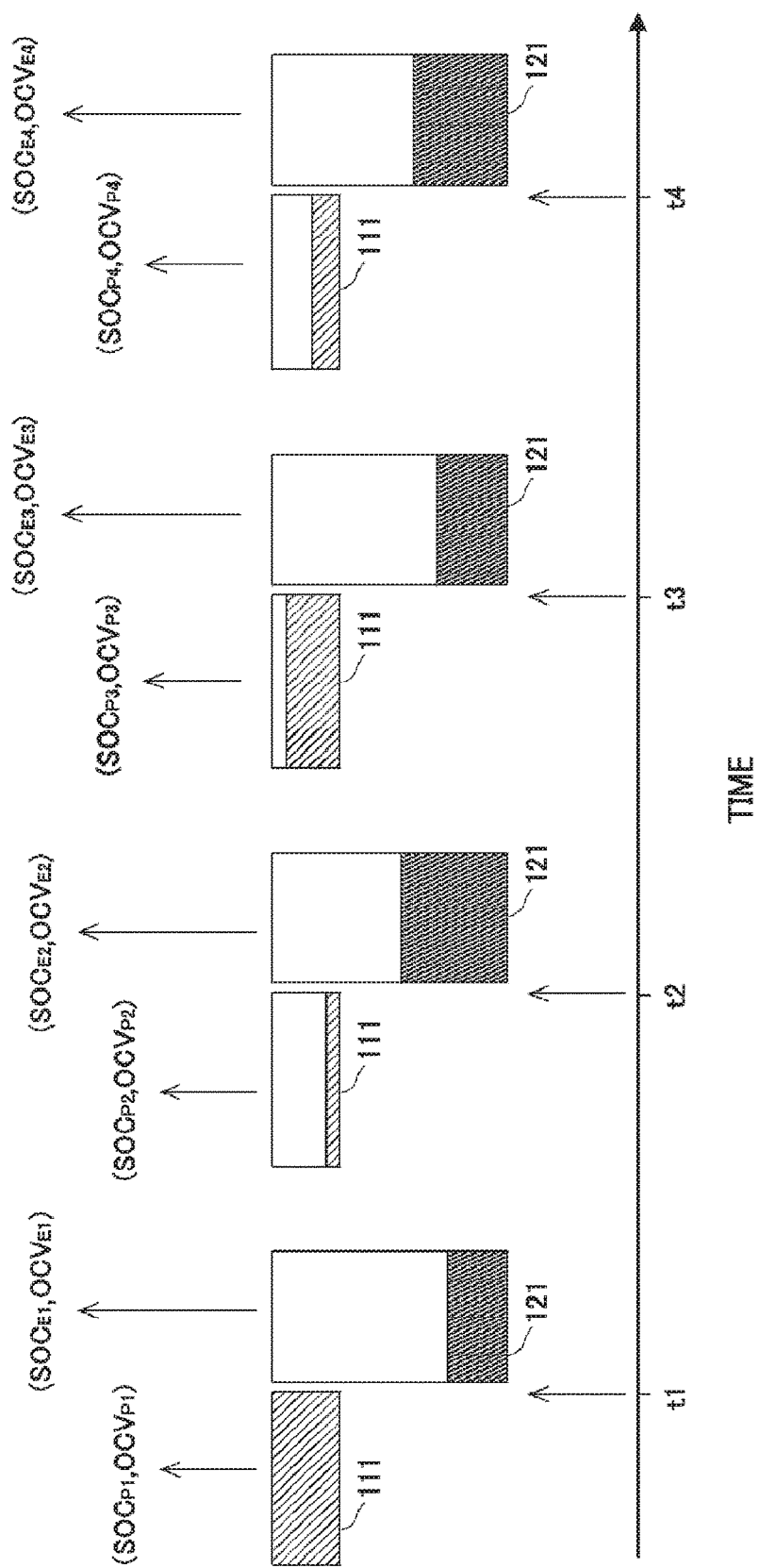
FIG. 7 shows situations where each of (SOC, OCV) data of a first storage battery 111 and a second storage battery 121 is acquired for each time when charge/discharge between the storage battery sections is performed.

FIG. 7 shows situations where each of (SOC, OCV) data of the first storage battery 111 and the second storage battery 121 is acquired for each time when the charge/discharge between the storage battery sections is performed. As illustrated, the control computation section 230 acquires $(SOC_{P1}, OCV_{P1})$ data which is the (SOC, OCV) data of the first storage battery 111 and $(SOC_{E1}, OCV_{E1})$ data which is the (SOC, OCV) data of the second storage battery 121 at a time t1.

After that, the control computation section 230 determines an acquisition target SOC which is the SOC of the first storage battery 111 to acquire the next (SOC, OCV) data. The control computation section 230 performs the charge/discharge between the storage battery sections and changes the SOC of the first storage battery 111 to the acquisition target SOC. Accordingly, the SOC of the second storage battery 121 also changes. At a time t2, $(SOC_{P2}, OCV_{P2})$ data which is the (SOC, OCV) data of the first storage battery 111 and $(SOC_{E2}, OCV_{E2})$ data which is the (SOC, OCV) data of the second storage battery 121 are acquired. Accordingly, by the charge/discharge between the storage battery sections for one time, the respective (SOC, OCV) data of the first storage battery 111 and the second storage battery 121 can be acquired.

Subsequently, the control computation section 230 determines the acquisition target SOC which is the SOC of the first storage battery 111 to acquire a further next (SOC, OCV) data. Here, the acquisition target SOC is a value different from any of $SOC_{P1}$ and $SOC_{P2}$. Then, the control computation section 230 performs the charge/discharge between the storage battery sections for one time and changes the SOC of the first storage battery 111 to the acquisition target SOC. Accordingly, the SOC of the second storage battery 121 also changes. Then, at a time t3, $(SOC_{P3}, OCV_{P3})$ data which is the (SOC, OCV) data of the first storage battery 111 and $(SOC_{E3}, OCV_{E3})$ data which is the (SOC, OCV) data of the second storage battery 121 are acquired.

Subsequently, the control computation section 230 determines the acquisition target SOC which is the SOC of the first storage battery 111 to acquire a further next (SOC, OCV) data. Here, the acquisition target SOC is a value different from any of $SOC_{P1}$, $SOC_{P2}$, and $SOC_{P3}$. Then, the control computation section 230 performs the charge/discharge between the storage battery sections for one time and changes the SOC of the first storage battery 111 to the acquisition target SOC. Accordingly, the SOC of the second storage battery 121 also changes. Then, at a time t4, $(SOC_{P4}, OCV_{P4})$ data which is the (SOC, OCV) data of the first storage battery 111 and $(SOC_{E4}, OCV_{E4})$ data which is the (SOC, OCV) data of the second storage battery 121 are acquired.

In this way, the control computation section 230 can acquire four pieces of (SOC, OCV) data with respect to each of the first storage battery 111 and the second storage battery 121 by acquiring the (SOC, OCV) data before and after each of three times of the charge/discharge between the storage battery sections. Accordingly, the (SOC, OCV) data of both of the first storage battery 111 and the second storage battery 121 can be efficiently acquired. For this reason, the (SOC, OCV) data of both of the first storage battery 111 and the second storage battery 121 can be collected in a short time. Also, the charge amount to be moved between the first storage battery 111 and the second storage battery 121 can be reduced. For that reason, the progress of the degradation of the first storage battery 111 and the second storage battery 121 can be suppressed.

Figure 8:
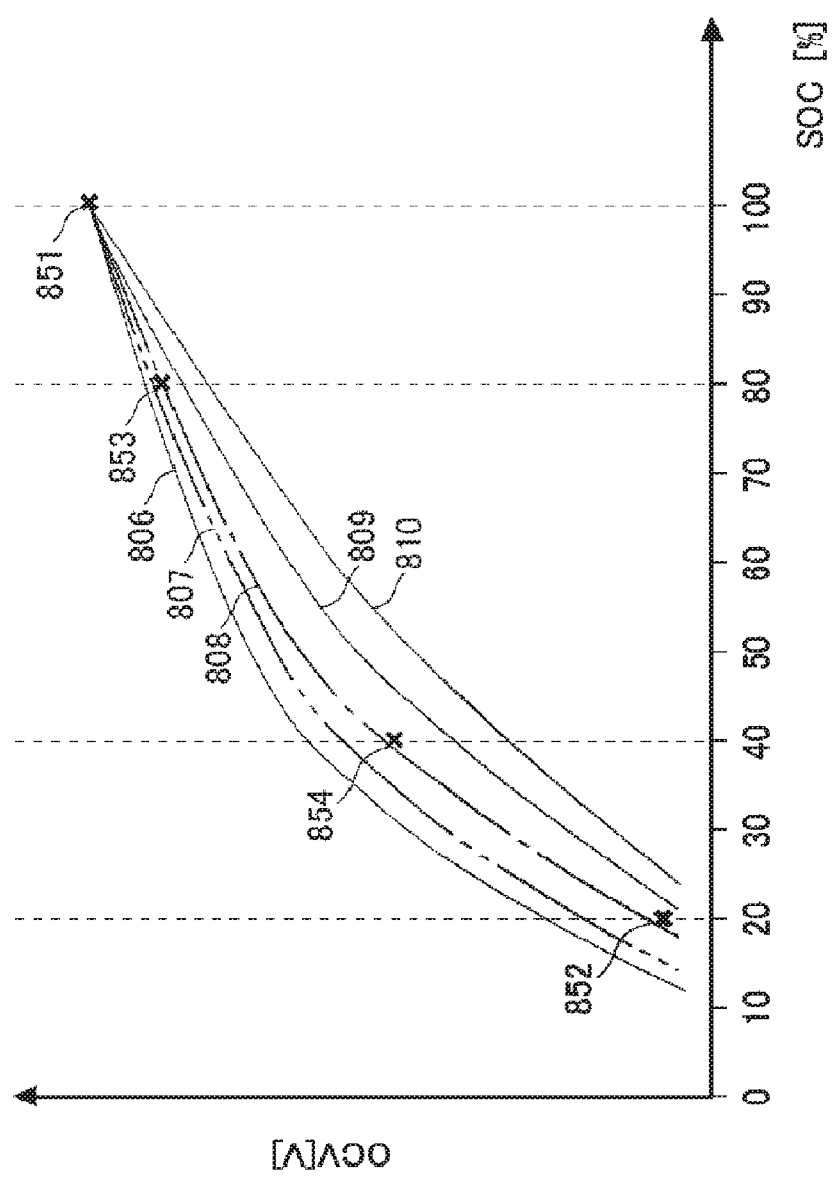
FIG. 8 shows a drawing for describing processes of determining a present SOC-OCV curve of the first storage battery 111 from the collected (SOC, OCV) data of the first storage battery 111.

FIG. 8 is a drawing for describing the process of determining the present SOC-OCV curve of the first storage battery 111 from the collected (SOC, OCV) data of the first storage battery 111. In FIG. 8, a SOC-OCV curve 810 indicates the SOC-OCV curve when the capacity retention rate of the first storage battery 111 is 100%. A SOC-OCV curve 809, a SOC-OCV curve 808, a SOC-OCV curve 807, and a SOC-OCV curve 806 respectively indicate the SOC-OCV curves when the capacity retention rates of the first storage battery 111 are 90%. 80%, 70%, and 60%.

Data 851, data 852, data 853, and data 854 indicate four aggregations of (SOC, OCV) data of the first storage battery 111 described with reference to FIG. 7. The control computation section 230 compares each of the SOC-OCV curve 810, the SOC-OCV curve 809, the SOC-OCV curve 808, the SOC-OCV curve 807, and the SOC-OCV curve 806 with the four pieces of (SOC, OCV) data, and determines the SOC-OCV curve 808 which is the most adaptable to the four pieces of (SOC, OCV) data as the present SOC-OCV curve. Also, the control computation section 230 determines 80% which is associated with the SOC-OCV curve 808 as the present capacity retention rate of the first storage battery 111. In this way, in a case of determining the SOC-OCV curve of the first storage battery 111, the control computation section 230 may match the collected (SOC, OCV) data to all of the SOC-OCV curves corresponding to all of the capacity retention rates and determine the present SOC-OCV curve.

In the descriptions for FIG. 7 and FIG. 8, in order to describe understandably easily the entire processing from the acquisition of the (SOC, OCV) data of the first storage battery 111 and the second storage battery 121 to the determination of the SOC-OCV curve of the first storage battery 111, the process of acquiring four pieces of (SOC, OCV) data and estimating the SOC-OCV curve from the four pieces of (SOC, OCV) data has been described. However, as described above, the present SOC-OCV curve may be estimated by determining the approximate curve or the approximate straight line calculated from the (SOC, OCV) data as the SOC-OCV curve. The accuracy of the approximate curve or the approximate straight line calculated from the (SOC, OCV) data can be higher as the number of the acquired (SOC, OCV) data is greater.

Figure 9:
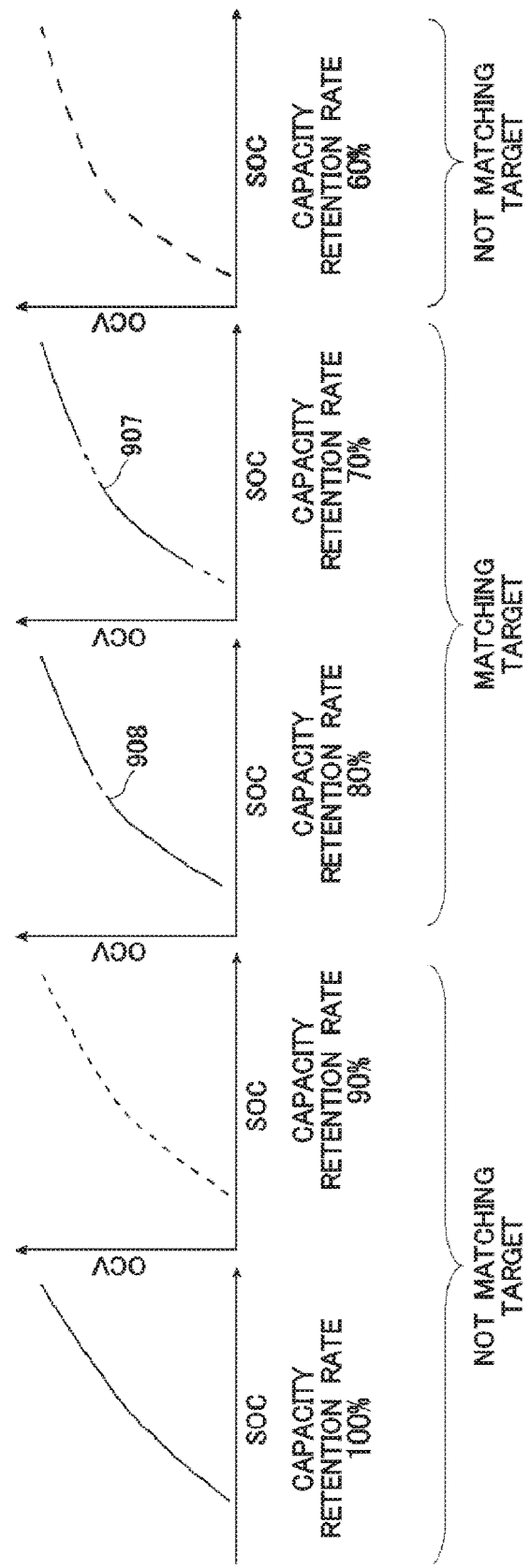
FIG. 9 shows a drawing for describing processes of selecting SOC-OCV curves of matching targets with respect to the (SOC, OCV) data of the second storage battery 121.

As described in FIG. 7, since the charge/discharge between the electric storage sections is performed such that the SOC of the first storage battery 111 becomes the acquisition target SOC, the collected (SOC, OCV) data of the second storage battery 121 is not necessarily suitable for the matching. In addition, since the second storage battery 121 has a larger capacity than the first storage battery 111, all of the SOCs of the second storage battery 121 cannot be collected by the charge/discharge between the electric storage sections in principle. According to such a reason, there is a possibility that a plurality of SOC-OCV curves are determined to be matched in the second storage battery 121. Here, by selecting the SOC-OCV curves in advance to be the matching targets, the accuracy for matching is improved. FIG. 9 is a drawing for describing the process of selecting the SOC-OCV curves to be the matching targets with respect to the (SOC, OCV) data of the second storage battery 121. Here, it is given that 80% is determined as the present capacity retention rate.

The control computation section 230 excludes the SOC-OCV curve associated with the capacity retention rate higher than 80% which is the present capacity retention rate from the matching targets. This is because that it is actually impossible that the capacity retention rate of the same storage battery becomes high with the lapse of time.

Also, the control computation section 230 determines a lower limit value of the capacity retention rate based on integrated values of currents flowing in and currents flowing out to/from the second storage battery 121 from the time when the SOC-OCV curve was determined last time. For example, the control computation section 230 calculates the maximum value that the capacity retention rate may decline based on the integrated values of currents. For example, the control computation section 230 determines the maximum value of the declined amounts of the capacity retention rate based on a map associated with the maximum value of the declined amount of the capacity retention rate and the integrated values of currents, and based on the integrated values of currents from the time when the SOC-OCV curve was determined last time. Then, the control computation section 230 determines the lower limit value of the capacity retention rate by subtracting the maximum value of the declined amount of the determined capacity retention rate from the present capacity retention rate of the second storage battery 121. It should be noted that a buffer may be further provided for the lower limit value of the capacity retention rate determined in this way by taking into account that the degradation of the storage battery also depends on the parameters other than the integrated values of currents or the singular degradation of the storage battery. For example, a capacity retention rate, which is smaller than the lower limit value of the capacity retention rate by a regulated value, may be determined as the maximum capacity retention rate which is impossible to decline further.

For example, in FIG. 9, if the lower limit value of the capacity retention rate is determined as 68%, the control computation section 230 excludes the SOC-OCV curve associated with the capacity retention rate of 60% from the matching targets. Accordingly, the control computation section 230 selects the SOC-OCV curve 908 associated with the capacity retention rate of 80% and the SOC-OCV curve 907 associated with the capacity retention rate of 70% as the SOC-OCV curves to be the matching targets to the (SOC, OCV) data of the second storage battery 121. It should be noted that in a case where a buffer being a regulated value of 10% is provided for the lower limit value of the capacity retention rate, the control computation section 230 may determine 58% as the minimum capacity retention rate which may decline. In this case, the control computation section 230 may exclude, from the matching processing, the SOC-OCV curves associated with the SOCs which are not more than 58% as the SOC-OCV curve of the matching target to the (SOC, OCV) data of the second storage battery 121, and select the SOC-OCV curve 908 associated with the capacity retention rate of 80%, the SOC-OCV curve 907 associated with the capacity retention rate of 70%, and the SOC-OCV curve associated with the capacity retention rate of 60%.

Figure 10:
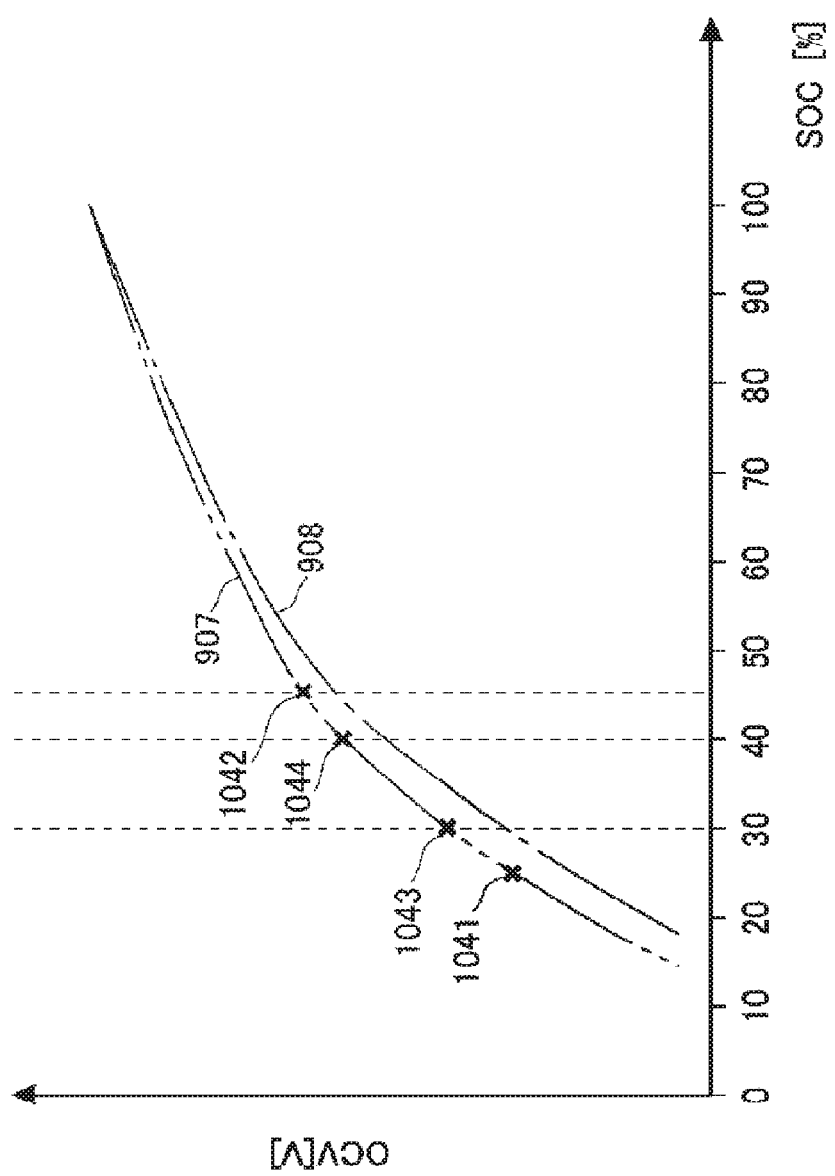
FIG. 10 shows a drawing for describing processes of determining a present SOC-OCV curve of the second storage battery 121 from the collected (SOC, OCV) data of the second storage battery 121.

FIG. 10 is a drawing for describing the process of determining the present SOC-OCV curve of the second storage battery 121 from the collected (SOC, OCV) data of the second storage battery 121. In FIG. 10, the SOC-OCV curve 908 and the SOC-OCV curve 907 indicate the SOC-OCV curves when the capacity retention rates of the second storage battery 121 are 80% and 70% respectively.

Data 1041, data 1042, data 1043, and data 1044 indicate the aggregations of the four pieces of (SOC, OCV) data of the second storage battery 121 described with reference to FIG. 7. The control computation section 230 compares each of the SOC-OCV curve 908 and the SOC-OCV curve 907 with the four pieces of (SOC, OCV) data, and determines the SOC-OCV curve 907 which is the most adaptable to the four pieces (SOC, OCV) data. Also, the control computation section 230 determines 70% associated with the SOC-OCV curve 907 as the present capacity retention rate of the second storage battery 121. In this way, in a case of determining the present SOC-OCV curve of the second storage battery 121, the control computation section 230 matches the collected (SOC, OCV) data to the SOC-OCV curve corresponding to some capacity retention rates selected based on the present capacity retention rate and determines the present SOC-OCV curve.

As illustrated, for the second storage battery 121, the range of the SOC of the collected (SOC, OCV) data is relatively narrow. This is because that since the battery capacity of the second storage battery 121 is larger than the battery capacity of the first storage battery 111, the (SOC, OCV) data over a wide range of the SOC cannot be acquired only by the charge/discharge between the storage battery sections between the first storage battery 111 and the second storage battery 121. Also, for that reason, the (SOC, OCV) data near the reference SOC cannot be acquired in many cases. Accordingly, compared with the SOC of the first storage battery 111, the accuracy of the SOC of the second storage battery 121 may become low in some cases. For that reason, there is a possibility that the (SOC, OCV) data of the second storage battery 121 is also adaptable to the SOC-OCV curve of the capacity retention rate which is apart from the present capacity retention rate. Therefore, if the (SOC, OCV) data is to be matched to all of the SOC-OCV curves corresponding to all of the capacity retention rates, like a case where the SOC-OCV curve of the first storage battery 111 was determined, there is a possibility that the SOC-OCV curve of the appropriate capacity retention rate is not selected.

On the other hand, as described with reference to FIG. 9 and FIG. 10, the control computation section 230 can exclude some SOC-OCV curves among the SOC-OCV curves of the matching targets from the matching targets based on the present capacity retention rate and the integrated values of the charge/discharge amount to the second storage battery 121. For that reason, the possibility that the SOC-OCV curve of the capacity retention rate which is apart from the present capacity retention rate is selected can be decreased. Accordingly, the accuracy of the SOC-OCV curve of the second storage battery 121 is increased. It should be noted that these methods may be used when matching for the first storage battery 111 and the accuracy of the SOC-OCV curve of the first storage battery 111 can be further increased.

Figure 11:
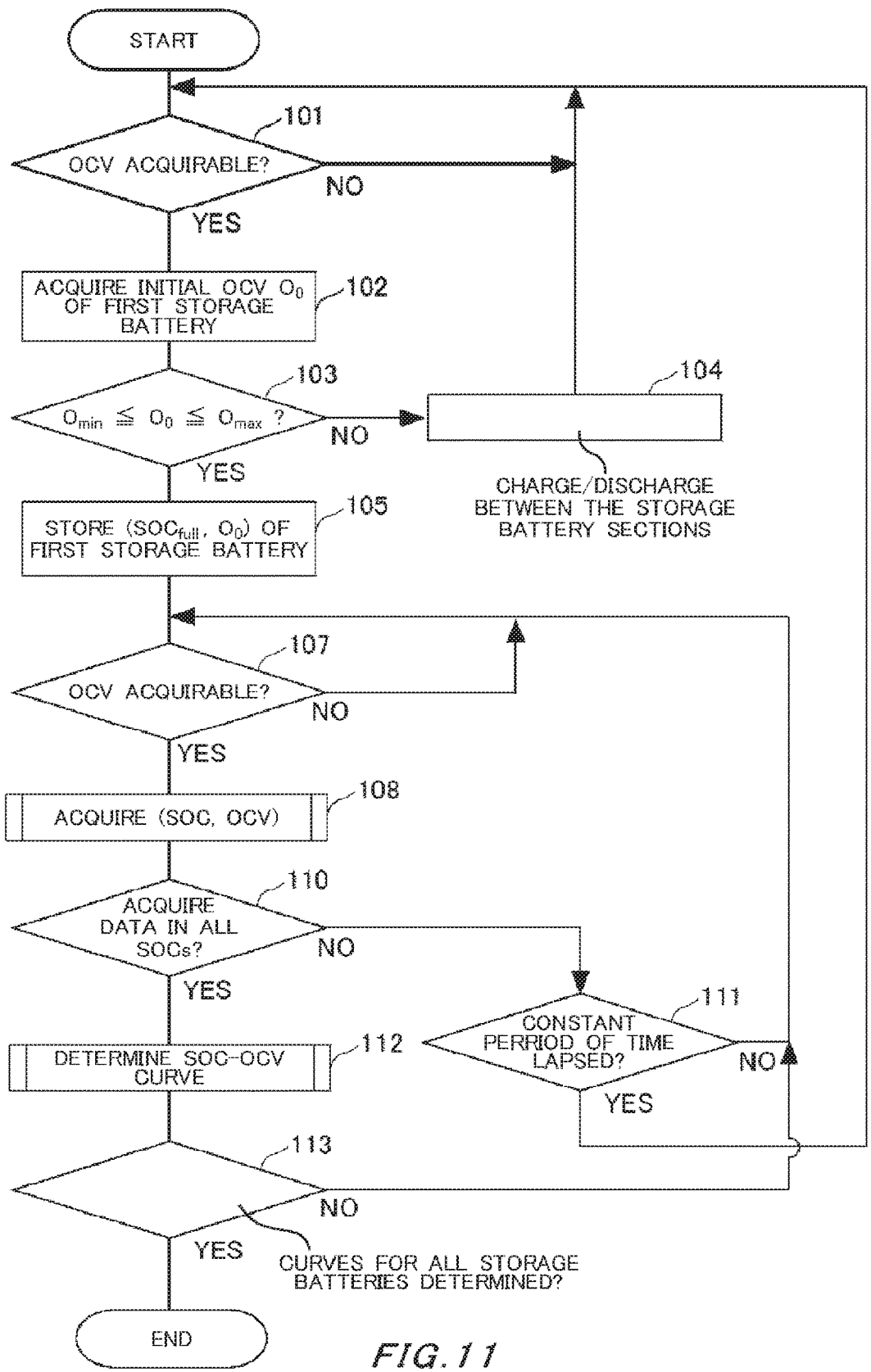
FIG. 11 shows a flow chart for determination of the SOC-OCV curves.

FIG. 11 is a flow chart for determination of the SOC-OCV curve. The flow starts from a time point when the battery ECU 130 received an instruction to determine the SOC-OCV curve from a control section of the transport device 10.

At a step S101, the control computation section 230 determines whether or not the OCV of the first storage battery 111 is acquirable. For example, in a case where the PDU 141 is requesting a supply of power, since the first switch 114 and the third switch 133 is set in the closed state with priority to the request, the control computation section 230 determines that the OCV cannot be acquired. In this case, the control computation section 230 standbys until the state where the OCV is acquirable.

If it is determined that the OCV of the first storage battery 111 is acquirable, the control computation section 230 proceeds to a step S102 and sends an opening/closing instruction signal $CW_1$ to the first switch 114 to set the first switch 114 in the open state. Then, $V_1$ is acquired from the first voltage sensor 112 and the voltage value is set as $O_0$ which is the initial OCV. At a step S103, the control computation section 230 determines whether or not the acquired $O_0$ is included in the range of the reference OCV.

Specifically, the control computation section 230 acquires the reference information of the first storage battery 111 from the BATT information storing section 233 and refers to the range from $O_{min}$ to $O_{max}$ of the reference OCV. Then, the control computation section 230 determines whether or not the relation of $O_{min} \leq O_0 < O_{min}$ is satisfied.

If it is determined that the acquired $O_0$ is not included in the range of the reference open voltage, the control computation section 230 proceeds to a step S104 and performs the charge/discharge between the storage battery sections. Specifically, the control computation section 230 sends the opening/closing instruction signals $CW_1$, $CW_2$, and $CW_3$ toward the respective switches, and set the first switch 114 and the second switch 124 in the closed state and the third switch 133 in the open state. Then, the control signals $CV_1$, $CV_2$ are sent toward the respective VCUs, and the conversion voltage value of the second VCU 132 is set as a value higher than the conversion voltage value of the first VCU 131. Accordingly, since the second storage battery 121 becomes to be in the discharge state and the first storage battery 111 becomes to be in the charge state, a certain charge moves from the second storage battery 121 to the first storage battery 111. The control computation section 230 may change the electricity amount of the moved charge by adjusting the opening/closing time of each switch and adjusting the conversion voltage value of each VCU. Also, the control computation section 230 may determine the electricity amount of the moved charge in accordance with a difference between the acquired $O_0$ and the range from $O_{min}$ to $O_{max}$ of the reference OCV.

It should be noted that in a case where the charge/discharge between the storage battery sections is performed by using two VCUs, only one VCU may be PWM controlled and the other VCU may perform a direct control. The direct control is a control to set the high-side switch of the DC/DC converter only in the closed state and to pass through currents without stepping up/down the voltages. When performing the direct control, for the control signals $CV_1$ and $CV_2$, "0" is designated as an instruction value of the conversion voltage.

At a step S104, as the charge/discharge between the storage battery sections is completed, the processing returns back to the step S101 again, and the loop is repeated until the condition of the step S103 is satisfied. If the condition of the step S103 is satisfied, the processing proceeds to a step S105.

At the step S105, the control computation section 230 stores the data of ($SOC_{full}$, OCV) in an internal storage section. Here, $SOC_{full}$ is a value corresponding to the SOC which is 100%. $SOC_{full}$ may be set as 100%. Also, $SOC_{full}$ may be set as a value not less than $S_{min}$ and not more than $S_{max}$. For example, $SOC_{full}$ may be $SOC_{full}=(S_{min}+S_{max})/2$.

Steps from S107 is processes of repeating the charge/discharge between the storage battery sections to acquire the (SOC, OCV) data. At the step S107, the control computation section 230 determines whether or not the OCV of at least one of the first storage battery 111 and the second storage battery 121 is acquirable. This determination is similar to the determination at the step S101. If the OCV of at least one of the first storage battery 111 and the second storage battery 121 is not acquirable, the control computation section 230 standbys until the acquisition is possible. If the OCV is acquirable, at a step S108, the (SOC, OCV) data of at least one of the first storage battery 111 and the second storage battery 121 is acquired. The processing at the step S108 will be described later.

The control computation section 230 proceeds to a step S110 and determines whether or not the (SOC, OCV) data in all of the SOCs being the acquisition targets of at least one of the first storage battery 111 and the second storage battery 121 is acquired. If it is determined that the acquisition is not done, the processing proceeds to a step S111.

The step S111 is carried out at a time point when the process of acquiring the next (SOC, OCV) data starts. At the step S111, it is determined that whether the acquisition of the data in all of the SOCs being the acquisition targets has been completed within a determined time. For example, the control computation section 230 determines whether or not a predetermined regulated time lapsed from the time when the data stored at the step S105 is acquired. The regulated time is set as 7 days, for example. The regulated time may be changed in accordance with a driving range, an environmental temperature, the accuracy requested to the SOC-OCV curve and the like. If the control computation section 230 determines that the regulated time does not lapse, the control computation section 230 returns back to the step S107 and sequentially acquires the data in the SOCs being the acquisition targets. If the control computation section 230 determines that the regulated time lapsed, the control computation section 230 returns during the step S101. In this case, the (SOC, OCV) data which has been acquired until then is discarded. By discarding the old data in this way, since the SOC-OCV curve is not determined by the data acquired in the different degradation states, the accuracy of the determined SOC-OCV curve is improved.

At the step S110, if it is determined that the data in all of the SOCs being the acquisition targets of at least one of the first storage battery 111 and the second storage battery 121 was acquired, the control computation section 230 proceeds to a step S112 and determines the SOC-OCV curves from the acquired plurality of data. The process in the step S112 will be described later. Subsequently, at a step S113, it is determined whether or not the SOC-OCV curves of both of the first storage battery 111 and the second storage battery 121 are determined. If the SOC-OCV curve of the first storage battery 111 or the second storage battery 121 is not determined yet, the processing returns back between the step S105 and the step S107. If both SOC-OCV curves are determined, the series of processes end.

Figure 12:
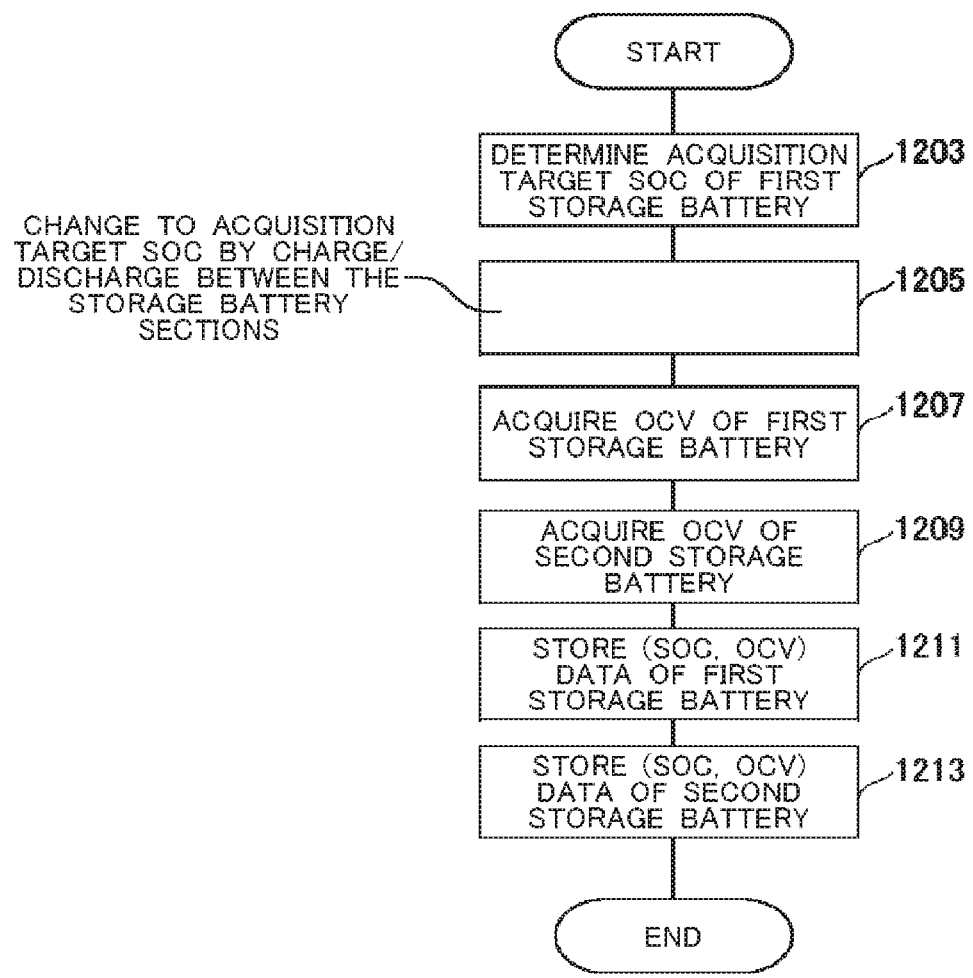
FIG. 12 shows a flow chart for acquiring the (SOC, OCV) data of at least one of the first storage battery 111 and the second storage battery 121.

FIG. 12 is a flow chart for acquiring the (SOC, OCV) data of at least one of the first storage battery 111 and the second storage battery 121. The flow shown in FIG. 12 is applied to the step S108 in the flow of FIG. 11.

First, the control computation section 230 determines that the (SOC, OCV) data of the first storage battery 111 is to be acquired and determines the acquisition target SOC to acquire the next (SOC, OCV) data (Step S1203). In this case, the control computation section 230 may determine, as the acquisition target SOC, the SOC which is not included in the SOCs of the acquired (SOC, OCV) data among the SOCs of the first storage battery 111 for which the acquisition of the (SOC, OCV) data is necessary in order to determine the SOC-OCV curve of the first storage battery 111.

Then, the control computation section 230 changes the SOC of the first storage battery 111 to the acquisition target SOC determined at the step S1203 by the charge/discharge between the storage battery sections (Step S1205). Subsequently, the control computation section 230 acquires the OCV of the first storage battery 111 (Step S1207). Also, the control computation section 230 acquires the OCV of the second storage battery 121 (Step S1209). Then, the control computation section 230 stores a combination of the acquisition target SOC and the OCV acquired at the step S1207 in the internal storage section as the (SOC, OCV) data of the first storage battery 111 (Step S1211). Also, the control computation section 230 calculates the SOC of the second storage battery 121 based on a moving amount of charges by the charge/discharge between the storage battery sections of the step S1205, and stores the combination of the calculated SOC and the OCV acquired at the step S1209 in the internal storage section as the (SOC, OCV) data of the second storage battery 121 (Step S1213). Accordingly, the series of processes for acquiring the (SOC, OCV) data end.

Accordingly, by the charge/discharge between the storage battery sections for one time, not only the (SOC, OCV) data of the first storage battery 111 but also the (SOC, OCV) data of the second storage battery 121 can be acquired. Accordingly, the (SOC, OCV) data necessary for the estimation of the SOC-OCV curve of at least the first storage battery 111 can be acquired rapidly. Also, at the same time, the (SOC, OCV) data which can be used for estimating the SOC-OCV curve of the second storage battery 121 can also be acquired. It should be noted that when the present SOC-OCV curve of the first storage battery 111 has been determined within the predetermined time from the present time, the (SOC, OCV) data in the predetermined SOC for use to estimating the SOC-OCV curve of the second storage battery 121 may be acquired. Specifically, the SOC of the second storage battery 121 is determined as the acquisition target SOC of the step S1203, and at the step S1205, the SOC of the second storage battery 121 may be changed to the acquisition target SOC by the charge/discharge between the storage battery sections. Other than this, when the present SOC-OCV curve of the first storage battery 111 has been determined within the predetermined time from the present time, the process of setting the SOC of the first storage battery 111 as the acquisition target SOC and the process of setting the SOC of the second storage battery 121 as the acquisition target SOC may be performed alternately.

Figure 13:
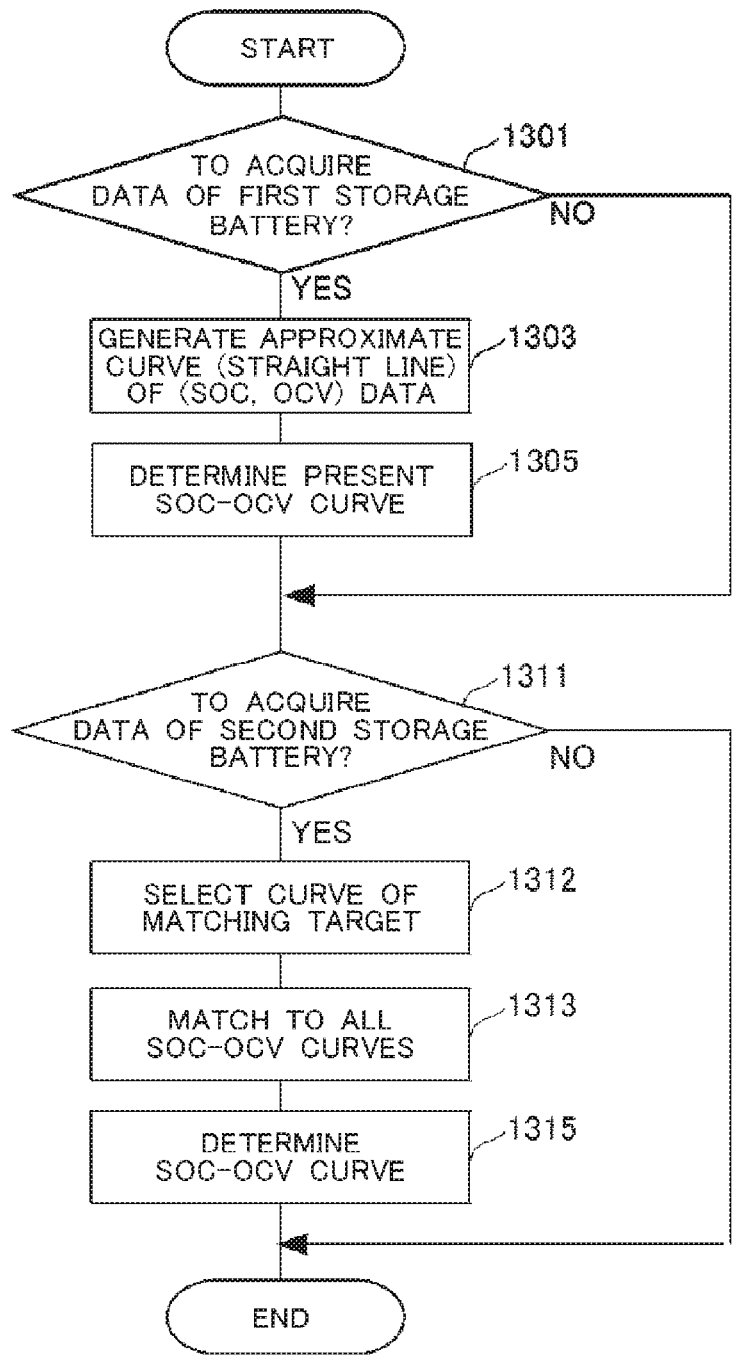
FIG. 13 shows a flow chart for determining the SOC-OCV curve from a plurality of (SOC, OCV) data.

FIG. 13 is a flow chart for determining the SOC-OCV curve from a plurality of (SOC, OCV) data. The flow shown in FIG. 13 is applied to the step S112 in the flow of FIG. 11.

At a step S1301, the control computation section 230 determines whether or not the (SOC, OCV) data in all of the SOCs being the acquisition target of the first storage battery 111 is acquired. If the determination at S1301 is true, the approximate curve or the approximate straight line for estimating the SOC-OCV curve is calculated from the (SOC, OCV) data (Step S1303), and the calculated approximate curve or approximate straight line are determined as the present SOC-OCV curve (S1305).

Subsequently, at a step S1311, the control computation section 230 determines whether or not the (SOC, OCV) data is acquired in all of the SOCs being the acquisition targets of the second storage battery 121. If the determination at S1311 is true, the SOC-OCV curves to be excluded from the matching targets are determined and the SOC-OCV curve being the matching target is selected (Step S1312). For example, as described with reference to FIG. 9, the control computation section 230 may exclude the SOC-OCV curves associated with the capacity retention rate higher than the present capacity retention rate from the matching targets. Also, the control computation section 230 may determine a lower limit value of the present predicted capacity retention rate based on the integrated values of currents flowing in and currents flowing out to/from the second storage battery 121 from the time when the SOC-OCV curve of the second storage battery 121 was determined last time, and exclude, from the matching targets, the SOC-OCV curves corresponding to the capacity retention rate which is smaller than the lower limit value by a regulated value or more.

Then, the control computation section 230 matches the acquired (SOC, OCV) data to one or more SOC-OCV curves selected at the step S1312 (Step S1313). Then, the present SOC-OCV curve is determined by selecting the SOC-OCV curve which is the most adaptable to the collected (SOC, OCV) data (Step S1315). Accordingly, the series of processes for determining the SOC-OCV curve end.

It should be noted that at the step S1303, the process of calculating the approximate curve or the approximate straight line to estimate the SOC-OCV curve from the (SOC, OCV) data is to be performed. In lieu of this process, a process of matching the (SOC, OCV) data to the SOC-OCV curve of the reference data may be performed. In this case, all of the SOC-OCV curves may be set as the matching targets for the first storage battery 111. In the (SOC, OCV) data of the first storage battery 111, the (SOC, OCV) data corresponding to the reference SOC exists, and also, the SOC of each (SOC, OCV) data is calculated from the charge transfer amount from the time when the charge was in the reference SOC. Also, for the first storage battery 111, the (SOC, OCV) data over a relatively wide range of the SOC is acquirable. For that reason, since the accuracy of the (SOC, OCV) data for the first storage battery 111 is relatively high, the present SOC-OCV curve can be determined with a high accuracy. On the other hand, similar to the process of S1312 with respect to the second storage battery 121, the control computation section 230 may exclude, from the matching targets, the SOC-OCV curves associated with the capacity retention rate higher than the present capacity retention rate. Also, the control computation section 230 may determine the lower limit value of the present predicted capacity retention rate based on the integrated values of currents flowing in and currents flowing out to/from the first storage battery 111 from the time when the SOC-OCV curve of the first storage battery 111 was determined last time, and exclude, from the matching targets, the SOC-OCV curves corresponding to the capacity retention rate smaller than the lower limit value by the regulated value or more.

In the above-described embodiment, although the (SOC, OCV) data was acquired by adjusting the OCV of the first storage battery 111 to be included in the reference OCV, the (SOC, OCV) data may be acquired by adjusting the SOC of the first storage battery 111 to be included in the reference SOC. In this case, the electricity amount of the charges moved by the charge/discharge between the storage battery sections may be determined based on the $C_{full}$ such that the SOC falls within the range of $S_R$ ($S_{min}$ to $S_{max}$).

Also, in the above-described embodiment, for the first storage battery 111, although at least one (SOC, OCV) data is adjusted to be included in the reference area, a plurality of (SOC, OCV) data which are not included in the reference area may be collected, and the SOC-OCV curves having the highest matching degree to that data group may be selected and determined from the reference data without performing such an adjustment. In this case, although the accuracy relative to a case where the (SOC, OCV) data is included in the reference area is decreased, the SOC-OCV curve can be determined further easily.

In a case of selecting and determining the SOC-OCV curve from the reference data, since the capacity retention rate is associated, the degradation progress degree of the storage battery at that time point can be grasped at the same time. In a case of calculating the approximate curve or the approximate straight line from the actually-measured (SOC, OCV) data, the SOC-OCV curve can be estimated even without the reference data. Also, the accuracy of the estimation of the SOC-OCV curve is increased. With the reference data, the degradation progress degree can also be grasped by specifying the SOC-OCV curve having a high matching degree of the shape to the approximate curve or the approximate straight line. The methods of determining the SOC-OCV curve may be also selectable by taking the situations requested by the system into account. Also, for example, to perform an error check of the acquired (SOC, OCV) data, both of them may be used at the same time.

Also, in the above-described embodiment, as described with reference to the FIG. 11 in particular, the procedure has been described that if a predetermined number of the coordinates cannot be acquired within a determined time, all of the (SOC, OCV) data is discarded and the processing is performed from the beginning. However, the plurality of (SOC, OCV) data individually excluded from the old (SOC, OCV) data and utilized for the matching process may be limited to the data acquired within a certain period of time. Also, the reference for selecting (SOC, OCV) data utilized for the matching process is not limited to the time when the (SOC, OCV) data was acquired. For example, in the charge/discharge between the storage battery sections, if an integrated amount of the electricity amount of the moved charges exceeds a predetermined electricity amount, the data may be excluded in turn from the old (SOC, OCV) data. In this case, the next integrated amount is updated to an integrated amount from the time point when the second old (SOC, OCV) data was acquired. It should be noted that the electricity amount being the reference may be changed in accordance with the driving range, the environmental temperature, the accuracy requested by the SOC-OCV curve and the like.

It should be noted that the transport device is not limited to an electric vehicle. The transport device may be a vehicle, such as a hybrid car comprising a power supply apparatus and an internal combustion engine, a train and the like. The transport device is not limited to a vehicle and includes various devices for transporting objects moving by land, air or water, or under water, such as airplanes or ships comprising a power supply apparatus. The transport device is a concept including various devices for transport comprising a power supply apparatus.

While the embodiments of the present invention have been described above, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . transport device, 100 . . . power storage device, 101 . . . first electric storage module, 102 . . . second electric storage module, 103 . . . charge/discharge circuit module, 111 . . . first storage battery, 112 . . . first voltage sensor, 113 . . . first current sensor, 114 . . . first switch, 121 . . . second storage battery, 122 . . . second voltage sensor, 123 . . . second current sensor, 124 . . . second switch, 130 . . . battery ECU, 131 . . . first VCU, 132 . . . second VCU, 133 . . . third switch, 142 . . . third voltage sensor, 141 . . . PDU, 151 . . . charging converter, 152 . . . power reception section, 153 . . . external power supply, 230 . . . control computation section, 231 . . . ΔSOC calculation section, 232 . . . time measuring section, 233 . . . BATT information storing section, 234 . . . determination line holding section, 235 . . . SOC response section, 290 . . . recording medium, 806 . . . SOC-OCV curve, 807 . . . SOC-OCV curve, 808 . . . SOC-OCV curve, 809 . . . SOC-OCV curve, 810 . . . SOC-OCV curve, 851 . . . data, 852 . . . data, 853 . . . data, 854 . . . data, 907 . . . SOC-OCV curve, 908 . . . SOC-OCV curve, 1041 . . . data, 1042 . . . data, 1043 . . . data, 1044 . . . data

What is claimed is:

1. A power supply apparatus, comprising:
a first electric storage section;
a second electric storage section which has a higher energy density and a lower output density than the first electric storage section; and
a circuit module which has a charge/discharge circuit that performs charge/discharge between the first electric storage section and the second electric storage section, and a control section that controls the charge/discharge circuit, wherein
the control section acquires first data and second data before and after each of a plurality of times of charge transfers between the first electric storage section and the second electric storage section, the first data being a combination of a first SOC and a first OCV that are respectively a charge rate and an open-end voltage of the first electric storage section, the second data being a combination of a second SOC and a second OCV that are respectively a charge rate and an open-end voltage of the second electric storage section,
performs a first operation of estimating a first correlation which is correlation information between an SOC and an OCV of the first electric storage section from an aggregation of the first data including reference data, and
performs a second operation of estimating a second correlation which is correlation information between an SOC and an OCV of the second electric storage section based on a comparison between a plurality of stored data stored by the control section and an aggregation of the second data,
wherein the reference data is a first data which has a deviation of SOCs to the same OCV in a plurality of degradation states of the first electric storage section, the deviation not more than a threshold.

2. The power supply apparatus according to claim 1, wherein
the control section stores a degradation state of the second electric storage section and the stored data, and associates the degradation state of the second electric storage section and the stored data with each other,
estimates a present degradation state of the second electric storage section, and
compares the aggregation of the second data with stored data only associated with a degradation state that progressed more than the present degradation state among the plurality of stored data.

3. The power supply apparatus according to claim 2, wherein
the control section determines the present degradation state based on the estimated second correlation.

4. The power supply apparatus according to claim 1, wherein
the control section selects stored data to be compared with a plurality of aggregations of the second data among the plurality of stored data based on an accumulated value of currents charged/discharged by the second electric storage section from a time when the second correlation was estimated last time.

5. The power supply apparatus according to claim 4, wherein
the control section selects the stored data to be compared with a plurality of aggregations of the second data by excluding the stored data associated with a degradation state which progressed more than a degradation state corresponding to the accumulated value of currents by a predetermined value or more.

6. The power supply apparatus according to claim 1, wherein
the control section generates the first correlation based on an approximate curve or an approximate straight line of the aggregation of the first data.

7. The power supply apparatus according to claim 6, wherein
the control section generates the second correlation by selecting with higher priority stored data having a higher adaptability to the aggregation of the second data among the plurality of stored data.

8. The power supply apparatus according to claim 1, wherein
the control section acquires the first SOC after the charge transfer based on a charge transfer amount to the first electric storage section from a time when the SOC of the first electric storage section is included in a range of a reference SOC which is an SOC having a difference of OCVs to the same SOC in a plurality of degradation states of the first electric storage section, the difference not more than a threshold, or a time when the OCV of the first electric storage section is included in a range of a reference OCV which is an OCV corresponding to the reference SOC.

9. The power supply apparatus according to claim 8, wherein
if the SOC of the first electric storage section is not included in the range of the reference SOC before performing the charge transfer, or if the OCV of the first electric storage section is not included in the range of the reference OCV before performing the charge transfer,
the control section performs, prior to the charge transfer, charge/discharge between the first electric storage section and the second electric storage section such that the SOC of the first electric storage section is included in the range of the reference SOC or the OCV of the first electric storage section is included in the range of the reference OCV.

10. The power supply apparatus according to claim 1, wherein
at least one of the first electric storage section and the second electric storage section supplies power to a driving section,
the charge/discharge circuit performs charge/discharge among the first electric storage section, the second electric storage section, and the driving section, and
the control section controls the charge/discharge circuit so as not to perform the charge/discharge between the first electric storage section and the driving section and between the second electric storage section and the driving section during the charge transfer.

11. The power supply apparatus according to claim 1, wherein
the control section calculates the SOC of the first electric storage section to respond based on the OCV of the first electric storage section and the first correlation when receiving an inquiry about the SOC of the first electric storage section, and calculates the SOC of the second electric storage section to respond based on the OCV of the second electric storage section and the second correlation when receiving an inquiry about the SOC of the second electric storage section.

12. The power supply apparatus according to claim 1, wherein
the second electric storage section has a larger battery capacity compared with the first electric storage section.

13. The power supply apparatus according to claim 1, wherein
the control section stores a degradation state of the second electric storage section and the stored data, and associates the degradation state of the second electric storage section and the stored data with each other,
estimates a present degradation state of the second electric storage section, and
compares the aggregation of the second data with stored data only associated with a degradation state which progressed more than the present degradation state among the plurality of stored data.

14. The power supply apparatus according to claim 1, wherein
the control section selects stored data to be compared with a plurality of aggregations of the second data among the plurality of stored data based on an accumulated value of currents charged/discharged by the second electric storage section from a time when the second correlation was estimated last time.

15. The power supply apparatus according to claim 14, wherein
the control section selects the stored data to be compared with a plurality of aggregations of the second data by excluding the stored data associated with a degradation state which progressed more than a degradation state corresponding to the accumulated value of currents by a predetermined value or more.

16. The power supply apparatus according to claim 2, wherein
the control section selects stored data to be compared with a plurality of aggregations of the second data among the plurality of stored data based on an accumulated value of currents charged/discharged by the second electric storage section from a time when the second correlation was estimated last time.

17. A transport device comprising the power supply apparatus according to claim 1.

18. An estimating method of estimating correlation information between an SOC and an OCV of a first electric storage section, the SOC and the OCV being respectively a charge rate and an open-end voltage, and correlation information between an SOC and an OCV of an second electric storage section in a power supply apparatus, the power supply apparatus having:
the first electric storage section;
the second electric storage section which has a higher energy density and a lower output density than the first electric storage section; and
a circuit module which has a charge/discharge circuit that performs charge/discharge between the first electric storage section and the second electric storage section and a control section that controls the charge/discharge circuit, wherein the estimating method comprises:

acquiring first data and second data before and after each of a plurality of times of charge transfers between the first electric storage section and the second electric storage section, the first data being a combination of a first SOC and a first OCV that are the SOC and the OCV of the first electric storage section, the second data being a combination of a second SOC and a second OCV that are the SOC and the OCV of the second electric storage section, performing a first operation of estimating a first correlation which is the correlation information between the SOC and the OCV of the first electric storage section from an aggregation of the first data including reference data, and performing a second operation of estimating a second correlation which is the correlation information between the SOC and the OCV of the second electric storage section based on a comparison between a plurality of stored data stored by the control section and an aggregation of the second data, wherein the reference data is a first data which has a deviation of SOCs to the same OCV in a plurality of degradation states of the first electric storage section, the deviation not more than a threshold.

19. A non-transitory computer readable medium storing a program for estimating correlation information between an SOC and OCV of a first electric storage section, the SOC and the OCV being respectively a charge rate and an open-end voltage, and correlation information between an SOC and OCV of a second electric storage section in a power supply apparatus, the power supply apparatus having:

the first electric storage section;

the second electric storage section which has a higher energy density and a lower output density than the first electric storage section; and a circuit module which has a charge/discharge circuit that performs charge/discharge between the first electric storage section and the second electric storage section and a control section that controls the charge/discharge circuit, wherein the program causes a computer to execute:

acquiring first data and second data before and after each of a plurality of times of charge transfers between the first electric storage section and the second electric storage section, the first data being a combination of a first SOC and a first OCV that are the SOC and the OCV of the first electric storage section, the second data being a combination of a second SOC and a second OCV that are the SOC and the OCV of the second electric storage section, performing a first operation of estimating a first correlation which is the correlation information between the SOC and the OCV of the first electric storage section from an aggregation of the first data including reference data, and performing a second operation of estimating a second correlation which is the correlation information between the SOC and the OCV of the second electric storage section based on a comparison between a plurality of stored data stored by the control section and an aggregation of the second electric storage section, wherein the reference data is a first data which has a deviation of SOCs to the same OCV in a plurality of degradation states of the first electric storage section, the deviation not more than a threshold.

20. The power supply apparatus according to claim 1, wherein the SOC of the reference data is in a range close to 100%.

* * * * *